US005790578A

United States Patent [19]

Takano

[11] Patent Number: 5,790,578
[45] Date of Patent: Aug. 4, 1998

[54] LASER DIODE WITH AN IMPROVED MULTIPLE QUANTUM WELL STRUCTURE ADOPTED FOR REDUCTION IN WAVELENGTH CHIRPING

[75] Inventor: Shinji Takano, Tokyo, Japan

[73] Assignee: NEC Corporation, Tokyo, Japan

[21] Appl. No.: 625,345

[22] Filed: Apr. 1, 1996

[30] Foreign Application Priority Data

Mar. 30, 1995 [JP] Japan .................................... 7-098034

[51] Int. Cl.[6] .................................................. H01S 3/19
[52] U.S. Cl. .................................. 372/45; 372/50; 372/96
[58] Field of Search ............................ 372/45, 46, 50, 372/96

[56] References Cited

U.S. PATENT DOCUMENTS 5,381,023   1/1995   Komatsu .............................. 257/85

*Primary Examiner*—James W. Davie
*Attorney, Agent, or Firm*—Young & Thompson

[57] ABSTRACT

The present invention provides another active layer structure provided in a light emission device for emitting a light with a predetermined wavelength. The active layer structure comprises a multiple quantum well structure and at least a second well layer. The multiple quantum well structure comprises alternating laminations of first well layers showing electroluminescence and potential barrier layers. The first well layers have a first set of energy band gaps which are uniform and correspond to the predetermined wavelength. An energy band gap is defined as a difference between a ground level of electrons in conduction band and a ground level of holes in valence band. The second well layer is provided within any of the potential barrier layers so that the second well layer is separated by the potential barrier layers from the first well layers. The second well layer has a second energy band gap in a range which is above the first set of energy band gaps and below a set of forbidden band widths of the potential barrier layers. The range of the second energy band gaps is defined so that the second well layer exits carrier accumulations and no electroluminescence to thereby ensure that carriers accumulated in the second well layer are injected into the first well layers when the first well layers are deficient in carriers for the electroluminescence.

12 Claims, 13 Drawing Sheets

LASER DIODE WITH AN IMPROVED MULTIPLE QUANTUM WELL STRUCTURE ADOPTED FOR REDUCTION IN WAVELENGTH CHIRPING

BACKGROUND OF THE INVENTION

The present invention provides a laser diode with a multiple quantum well structure.

A conventional laser diode will be described with reference to FIGS. 1 and 2A through 2C. The conventional laser diode is provided as illustrated in FIGS. 1 and 2A. The conventional laser diode is formed on an n-type InP substrate 1. A surface of the n-type InP substrate 1 is formed with a grating 9. An optical guide layer 2 is provided which extends over the grating 9. The optical guide layer 2 is made of InGaAs which has a wavelength composition of 1.2 micrometers. An active layer 3 is provided, which extends over the optical guide layer 2. The active layer has a multiple quantum well structure. An optical guide layer 4 is provided, which extends over the active layer 3. A p-type InP cladding layer 5 is provided, which extends over the optical guide layer 4. A p-type InP layer 6 is provided which extends over the p-type InP cladding layer 5. A p-type InGaAsP contact layer 7 is provided which extends over the p-type InP layer 6. A p-type electrode is provided on the p-type InGaAsP contact layer 7.

The following descriptions will focus on the multiple quantum well structure of the active layer 3 with reference to FIGS. 2B and 2C. The multiple quantum well structure comprises alternating laminations of electroluminescence well layers 31 and potential barrier layers 32.

The electroluminescence well layer 31 comprises a +0.8%-strained InGaAs layer which has a thickness of 5.5 nanometers and a wavelength composition of 1.72 micrometers. The potential barrier layer 32 comprises a non-strained InGaAs which has a thickness of 4.0 micrometers and a wavelength composition of 1.15 micrometers. The electroluminescence well layer 31 has an energy band gap $E_{g1}$ of 0.80 eV, where the energy band gap is defined as a difference between a ground level of electrons in conduction band and a ground level of holes in valence band. The energy band gap $E_{g1}$ of 0.80 eV of the electro-luminescence well layer 31 is converted into a wavelength of 1.55 micrometers.

The above electroluminescence well layer 35 having the small energy band gap $E_{g1}$ of 0.80 eV shows electroluminescence at a wavelength of 1.55 micrometers. This electroluminescence is caused by the induced transition by electron-hole recombination. This means that the electroluminescence well layers become necessarily deficient in carriers. This makes the electroluminescence well layers deficient in carriers for the electroluminescence. This causes a considerable variation in the refractive index of a laser medium. This enlarges an active wavelength chirping.

SUMMARY OF THE INVENTION

Accordingly, it is an object of the present invention to provide an improved active layer structure provided in a light emission device free from the above problems or disadvantages.

It is a further object of the present invention to provide an improved active layer structure provided in a light emission device, which suppresses an active wavelength chirping.

It is a furthermore object of the present invention to provide an improved active layer structure provided in a light emission device, which causes either almost no variation in refractive index of a laser medium or a considerable reduction in variation in refractive index of a laser medium.

It is a still further object of the present invention to provide a semiconductor laser device having an improved active layer structure free from the above problems or disadvantages.

It is yet a further object of the present invention to provide a semiconductor laser device having an improved active layer structure which suppresses an active wavelength chirping.

It is moreover object of the present invention to provide a semiconductor laser device having an improved active layer structure which causes either almost no variation in refractive index of a laser medium or a considerable reduction in variation in refractive index of a laser medium.

The above and other objects, features and advantages of the present invention will be apparent from the following descriptions.

The present invention provides an active layer structure provided in a light emission device for emitting a light with a predetermined wavelength. The active layer structure comprises an electroluminescence section and a carrier accumulation section in alignment with the electroluminescence section. The electroluminescence section comprises a first multiple quantum well structure comprising alternating laminations of first well layers showing electroluminescence and first potential barrier layers. The first well layers have a first set of energy band gaps which, are uniform and correspond to the predetermined wavelength. The carrier accumulation section comprises a second multiple quantum well structure comprising alternating laminations of second well layers and second potential barrier layer. An energy band gap is defined as a difference between a ground level of electrons in conduction band and a ground level of holes in valence band. The second well layers have a second set of energy band gaps in a range which is above the first set of energy band gaps and below a set of forbidden band widths of the first potential barrier layers. The range of the second set of energy band gaps is defined so that the second well layers exhibit carrier accumulations and no electroluminescence to thereby ensure that carriers accumulated in the second well layers are injected into the first well layers when the first well layers are deficient in carriers for the electroluminescence.

The present invention also provides a semiconductor laser device including an active layer structure which is provided on an optical guide layer provided on a surface, having a grating structure, of a semiconductor substrate. The active layer structure comprising an electroluminescence section and a carrier accumulation section in alignment with the electroluminescence section. The electroluminescence section comprises a first multiple quantum well structure comprising alternating laminations of first well layers showing electroluminescence and first potential barrier layers. The first well layers have a first set of a uniform energy band gap which corresponds to the predetermined wavelength. The carrier accumulation section comprises a second multiple quantum well structure comprising alternating laminations of second well layers and second potential barrier layers, provided that energy band gap is defied as a difference between a ground level of electrons in conduction band and a ground level of holes in valence band. The second well layers have a second set of energy band gaps in a range which is above the first set of energy band gaps and below a set of forbidden band widths of the first potential barrier layers. The range of the second set of energy band gaps is defined so that the second well layers exhibit carrier accumulations and no electro-luminescence to thereby ensure that carriers accumulated in the second well layers are injected into the first well layers when the first well layers are deficient in carriers for the electroluminescence.

The present invention provides another active layer structure provided in a light emission device for emitting a light with a predetermined wavelength. The active layer structure comprises a multiple quantum well structure and at least a second well layer. The multiple quantum well structure comprises alternating laminations of first well layers showing electroluminescence and potential barrier layers. The first well layers have a first set of energy band gaps which are uniform and corresponds to the predetermined wavelength, provided that energy band gap is defined as a difference between a ground level of electrons in conduction band and a ground level of holes in valence band. The second well layer is provided within any of the potential barrier layers so that the second well layer is separated via the potential barrier layers from the first well layers. The second well layer has a second energy band gap in a range which is above the first set of energy band gaps and below a set of forbidden band widths of the potential barrier layers. The range of the second energy band gaps is defined so that the second well layer exhibits carrier accumulations and no electroluminescence to thereby ensure that carriers accumulated in the second well layer are injected into the first well layers when the first well layers are deficient in carriers for the electroluminescence.

The present invention also provides another semiconductor laser device including an active layer structure which is provided on an optical guide layer provided on a surface, having a grating structure, of a semiconductor substrate. The active layer structure comprises a multiple quantum well structure and a multiple quantum well structure. The multiple quantum well structure comprises alternating laminations of first well layers showing electroluminescence and potential barrier layers. The first well layers have a first set of energy band gaps which are uniform and corresponds to the predetermined wavelength, provided that energy band gap is defined as a difference between a ground level of electrons in conduction band and a ground level of holes in valence band. The multiple quantum well structure is provided within any of the potential barrier layers so that the second well layer is separated via the potential barrier layers from the first well layers. The second well layer has a second energy band gap in a range which is above the first set of energy band gaps and below a set of forbidden band widths of the potential barrier layers. The range of the second energy band gaps is defined so that the second well layer exhibits carrier accumulations and no electro-luminescence to thereby ensure that carriers accumulated in the second well layers are injected into the first well layers when the first well layers are deficient in carriers for the electroluminescence.

The present invention provides still another active layer structure provided in a light emission device for emitting a light with a predetermined wavelength. The active layer structure comprises a multiple quantum well structure and at least a second well layer. The multiple quantum well structure comprises alternating laminations of first well layers showing electroluminescence and potential barrier layers. The first well layers have a first set of energy band gaps which are uniform and corresponds to the predetermined wavelength, provided that energy band gap is defined as a difference between a ground level of electrons in conduction band and a ground level of holes in valence band. The second well layer is provided on any interface of the first well layers and the potential barrier layers so that the second well layer is sandwiched between the first well layer and the potential barrier layer. The second well layer has a second energy band gap in a range which is above the first set of energy band gaps and below a set of forbidden band widths of the potential barrier layers. The range of the second energy band gap is defined so that the second well layer exhibits carrier accumulations and no electroluminescence. This ensures that carriers accumulated in the second well layer are injected into the first well layers when the first well layers are deficient in carriers for the electroluminescence.

The present invention also provides still another semiconductor laser device including an active layer structure which is provided on an optical guide layer provided on a surface, having a grating structure, of a semiconductor substrate. The active layer structure comprises a multiple quantum well structure and at least a second well layer. The multiple quantum well structure comprises alternating laminations of first well layers showing electroluminescence and potential barrier layers. The first well layers have a first set of energy band gaps which are uniform and corresponds to the predetermined wavelength, provided that energy band gap is defined as a difference between a ground level of electrons in conduction band and a ground level of holes in valence band. The second well layer is provided on any interface of the first well layers and the potential barrier layers so that the second well layer is sandwiched between the first well layer and the potential barrier layer. The second well layer has a second energy band gap in a range which is above the first set of energy band gaps and below a set of forbidden band widths of the potential barrier layers. The range of the second energy band gap is defined so that the second well layer exhibits carrier accumulations and no electroluminescence. This ensures that carriers accumulated in the second well layer are injected into the first well layers when the first well layers are deficient in carriers for the electroluminescence.

The present invention also provides yet another active layer structure provided in a light emission device for emitting a light with a predetermined wavelength. The active layer structure comprises a multiple quantum well structure and at least a second well layer. The multiple quantum well structure comprises alternating laminations of first well layers showing electroluminescence and potential barrier layers. The first well layers have a first set of energy band gaps which are uniform and corresponds to the predetermined wavelength, provided that energy band gap is defined as a difference between a ground level of electrons in conduction band and a ground level of holes in valence band. The second well layer is provided at any side of the multiple quantum well structure so that the second well layer is separated via the potential barrier layers from the first well layers. The second well layer has a second energy band gap in a range which is above the first set of energy band gaps and below a set of forbidden band widths of the potential barrier layers. The range of the second energy band gap is defined so that the second well layer exhibits carrier accumulations and no electroluminescence. This ensures that carriers accumulated in the second well layer are injected into the first well layers when the first well layers are deficient in carriers for the electroluminescence.

The present invention also provides yet another semiconductor laser device including an active layer structure which is provided on an optical guide layer provided on a surface, having a grating structure, of a semiconductor substrate. The active layer structure comprises a multiple quantum well structure and at least a second well layer. The multiple quantum well structure comprises alternating laminations of first well layers showing electroluminescence and potential barrier layers. The first well layers have a first set of energy band gaps which are uniform and corresponds to the predetermined wavelength, provided that energy band gap is defined as a difference between a ground level of electrons in conduction band and a ground level of holes in valence band. The second well layer is provided at any side of the multiple quantum well structure so that the second well layer is separated via the potential barrier layers from the first well layers. The second well layer has a second energy band gap in a range which is above the first set of energy band gaps and below a set of forbidden band widths of the potential barrier layers. The range of the second energy band gap is defined so that the second well layer exhibits carrier accumulations and no electroluminescence. This ensures that carriers accumulated in the second well layer are injected into the first well layers when the first well layers are deficient in carriers for the electroluminescence.

BRIEF DESCRIPTIONS OF THE DRAWINGS

Preferred embodiments of the present invention will be described in detail with reference to the accompanying drawings.

Figure 1:
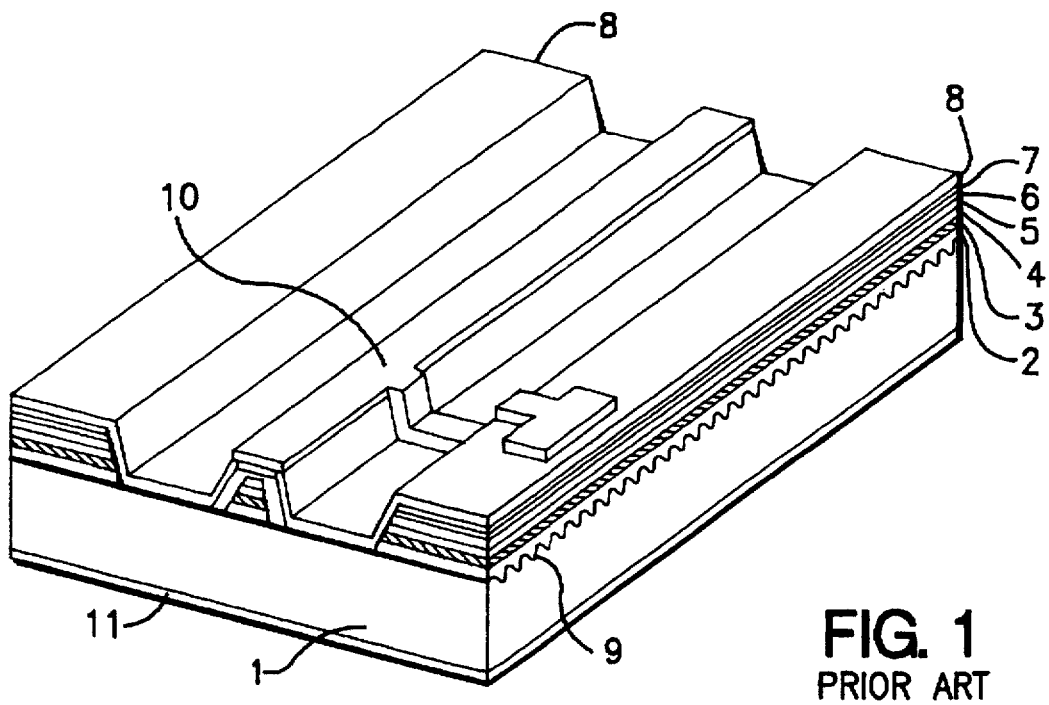
FIG. 1 is a squint view illustrative of the conventional laser diode.
Figure 4:
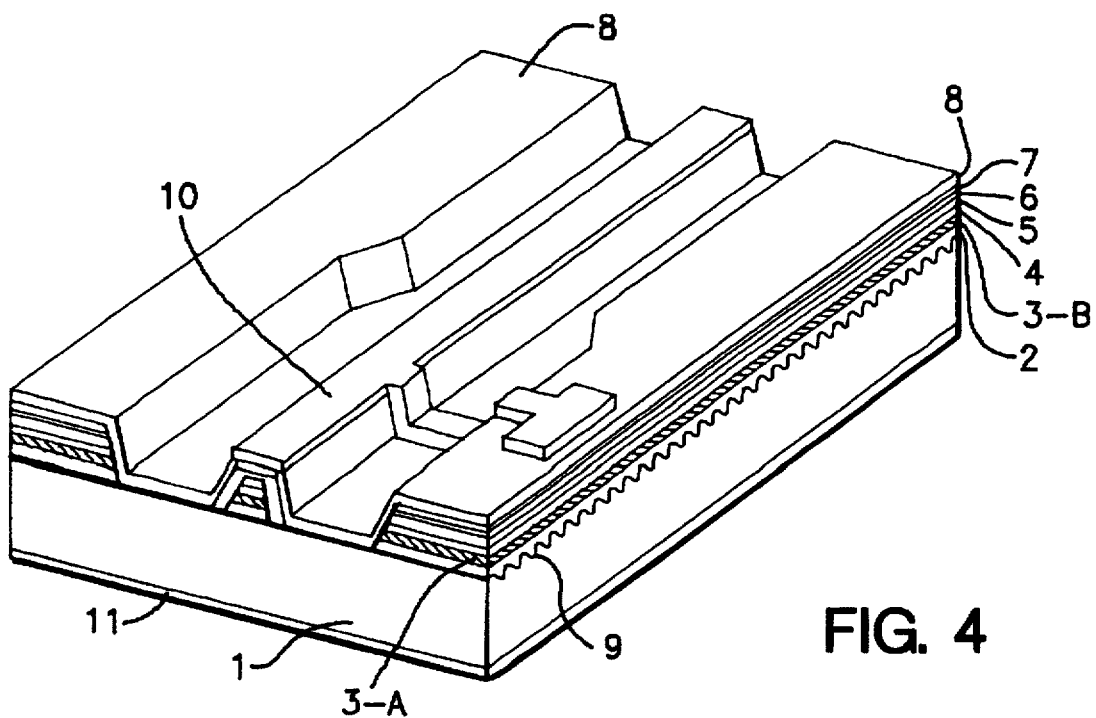
Figure 2A:
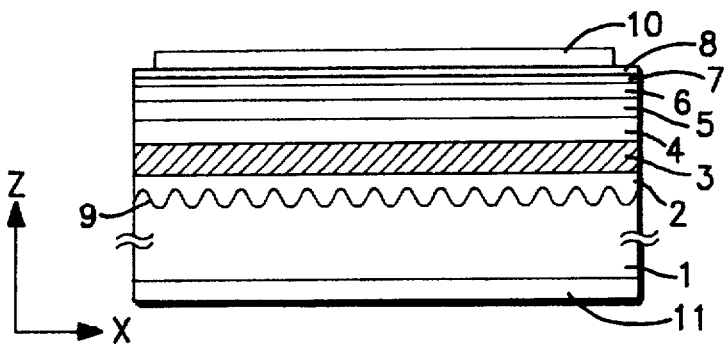
FIG. 2A is a cross sectional elevation view illustrative of the conventional laser diode of FIG. 1.
Figure 2B:
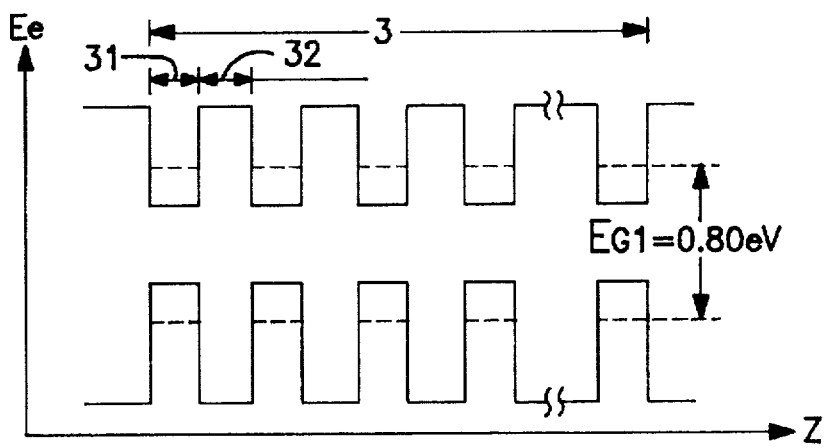
FIG. 2B is a diagram illustrative of an energy band gap profile of the conventional multiple quantum well structure of an active layer in the conventional laser diode of FIG. 2A.
Figure 2C:
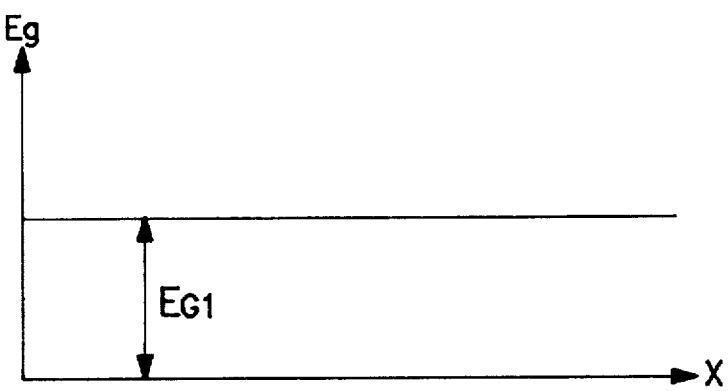
FIG. 2C is a diagram illustrative of an energy band gap level of well layers in the conventional multiple quantum well structure of FIG. 2B.
Figure 3:
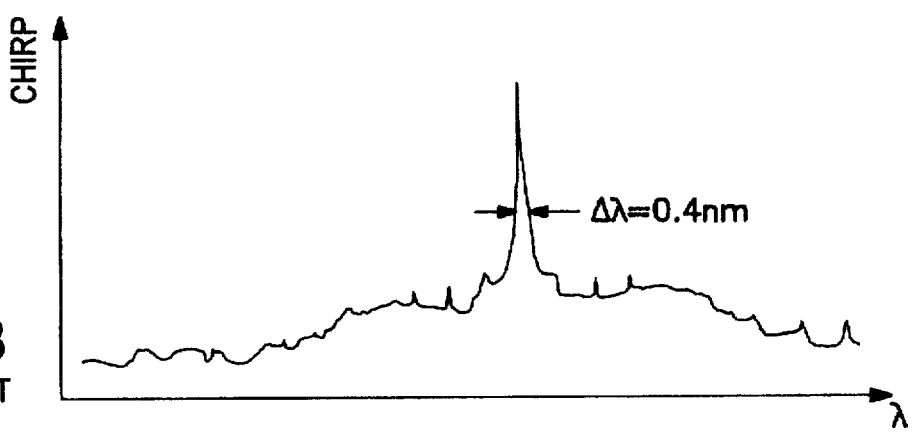
FIG. 3 is a diagram illustrative of an active wavelength chirping property of the conventional laser diode with the normal multiple quantum well structure.

FIG. 4 a squint view illustrative of a novel laser diode in a first embodiment according to the present invention.

Figure 5A:
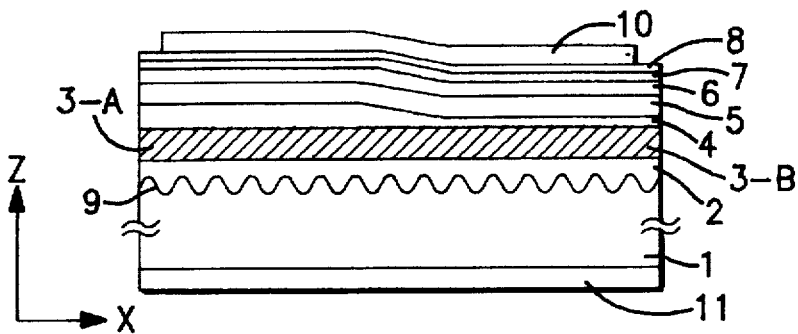

FIG. 5A is a cross sectional elevation view illustrative of a novel laser diode of FIG. 4.

Figure 5B:
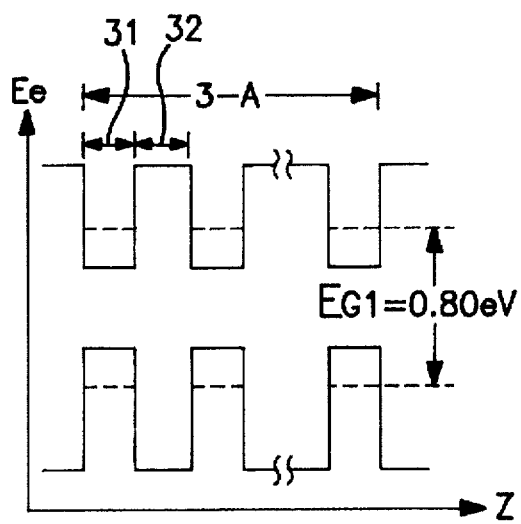

FIG. 5B is a diagram illustrative of an energy band gap profile of a multiple quantum well structure in an electroluminescence region of an active layer in a novel laser diode of FIG. 5A.

Figure 5C:
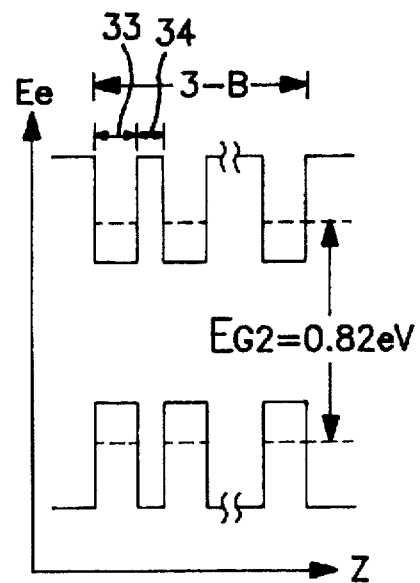

FIG. 5C is a diagram illustrative of an energy band gap profile of a multiple quantum well structure in a carrier accumulation region of an active layer in a novel laser diode of FIG. 5A.

Figure 5D:
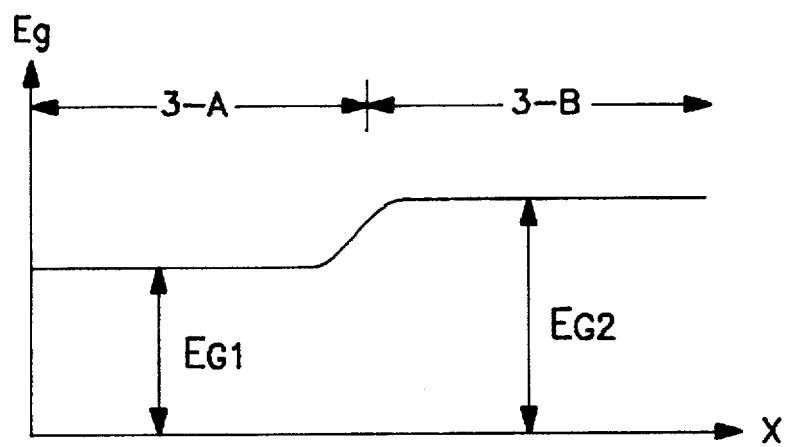

FIG. 5D is a diagram illustrative of energy band gap levels of a multiple quantum well structure over an electroluminescence region and a carrier accumulation region in a novel laser diode of FIG. 5A.

Figure 6A:
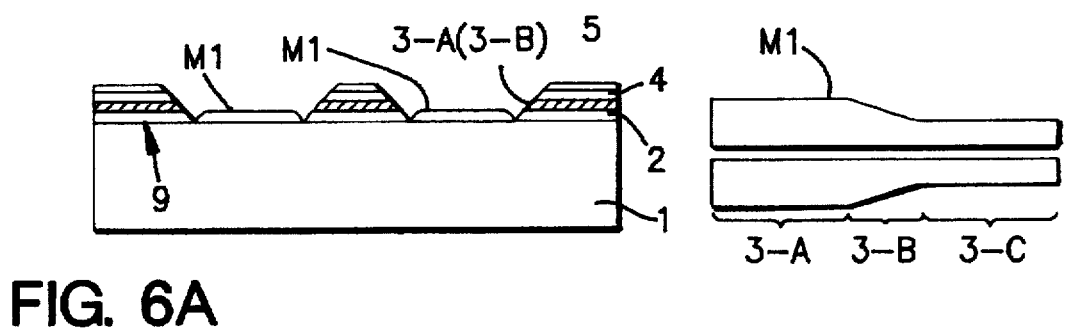
Figure 6B:
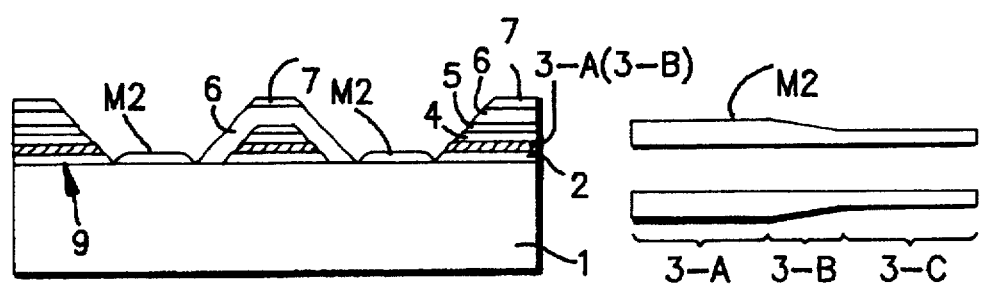
Figure 6C:
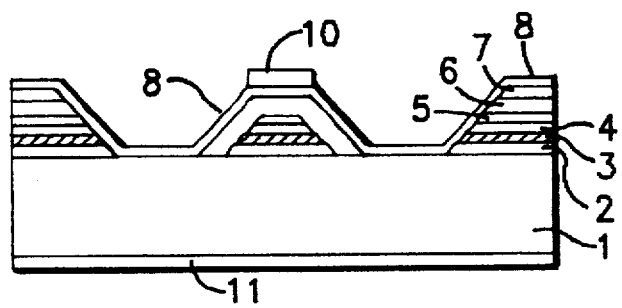

FIGS. 6A through 6C are fragmentary cross sectional elevation views illustrative of fabrication processes for a novel laser diode of FIG. 4.

Figure 7:
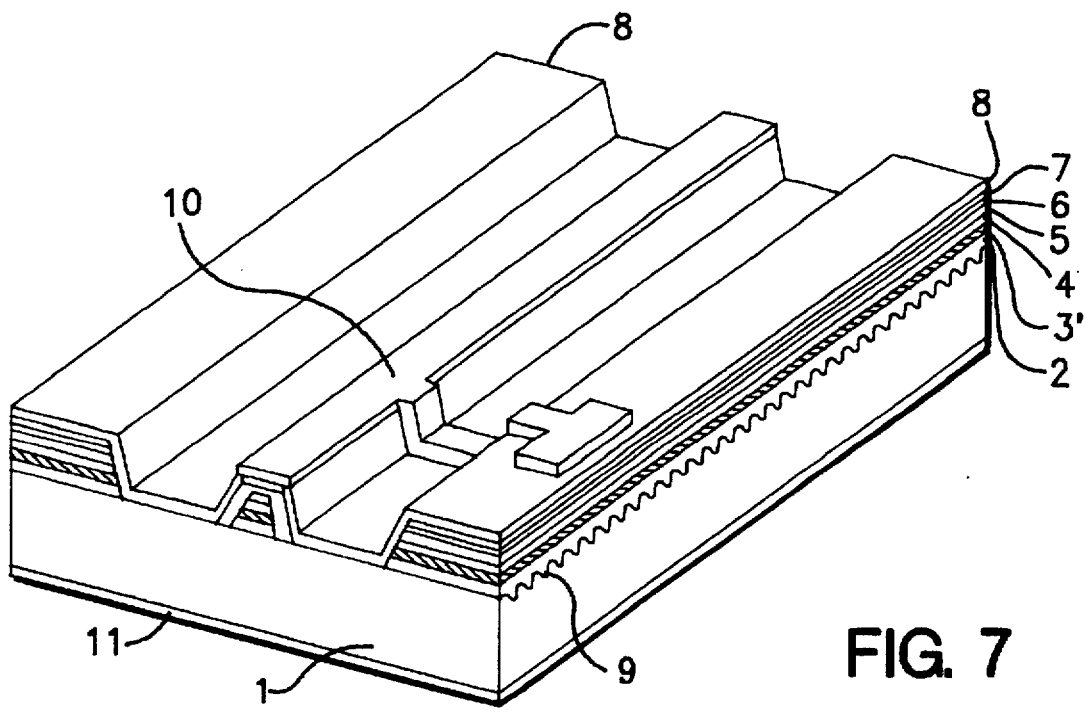

FIG. 7 a squint view illustrative of a novel laser diode in a second embodiment according to the present invention.

Figure 8A:
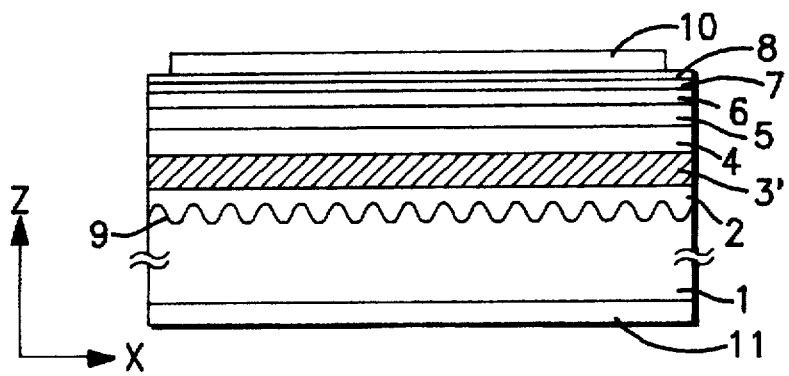

FIG. 8A is a cross sectional elevation view illustrative of a novel laser diode of FIG. 7.

Figure 8B:
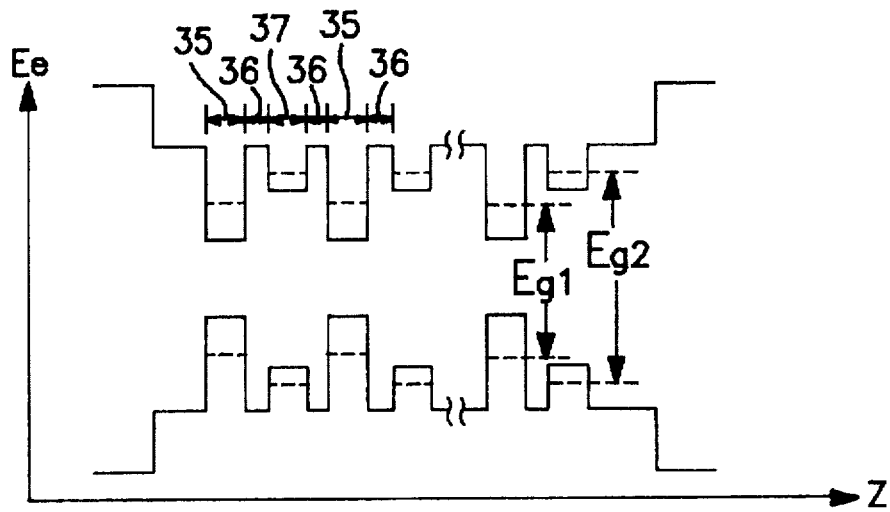

FIG. 8B is a diagram illustrative of an energy band gap profile of a multiple quantum well structure of an active layer in a novel laser diode of FIG. 8A.

Figure 8C:
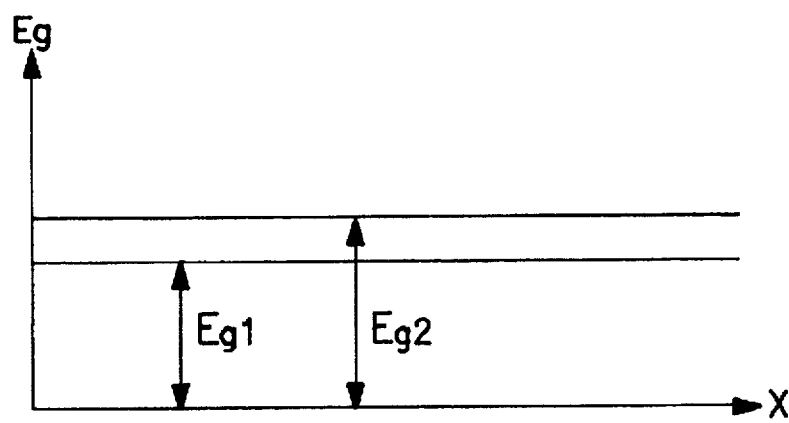

FIG. 8C is a diagram illustrative of energy band gap levels of a multiple quantum well structure in a novel laser diode of FIG. 8A.

Figure 9:
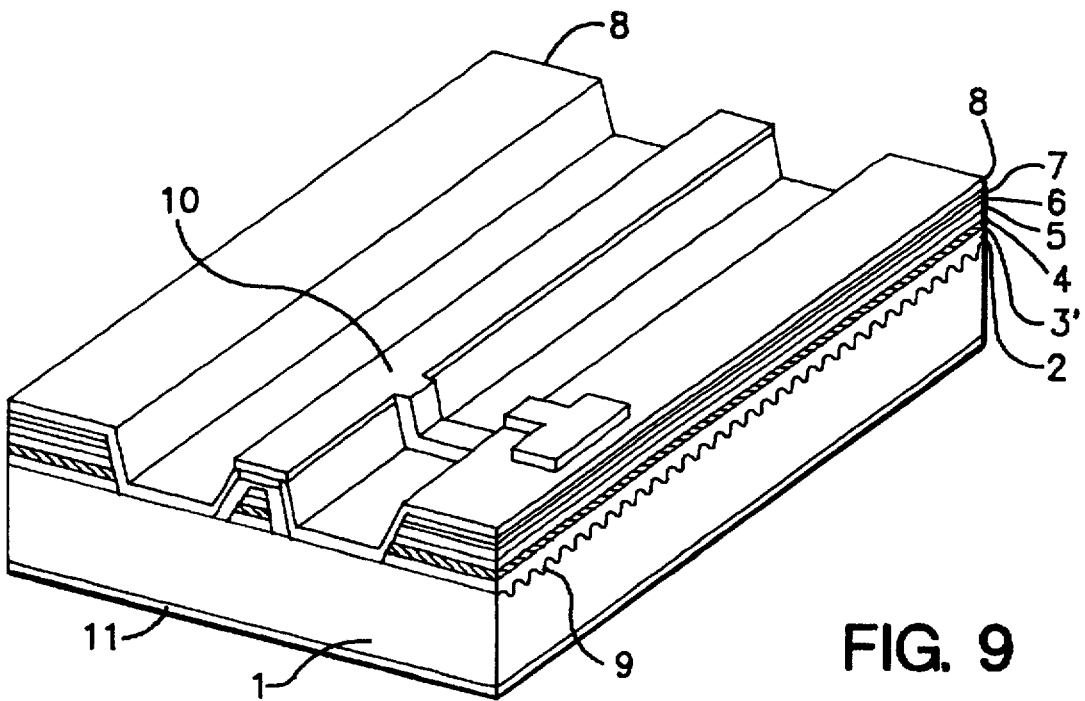

FIG. 9 a squint view illustrative of a novel laser diode in a third embodiment according to the present invention.

Figure 10A:
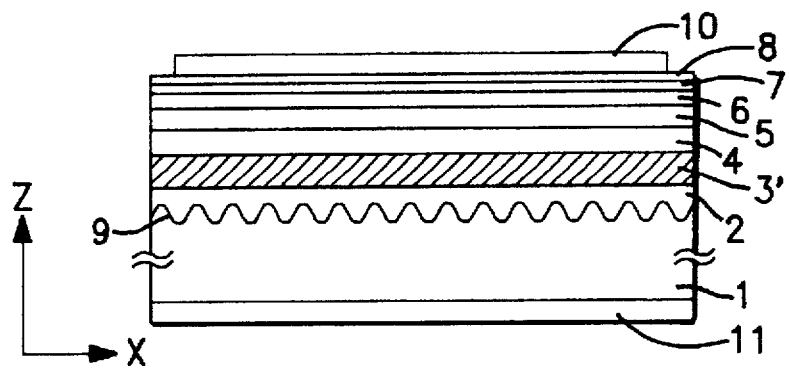

FIG. 10A is a cross sectional elevation view illustrative of a novel laser diode of FIG. 9.

Figure 10B:
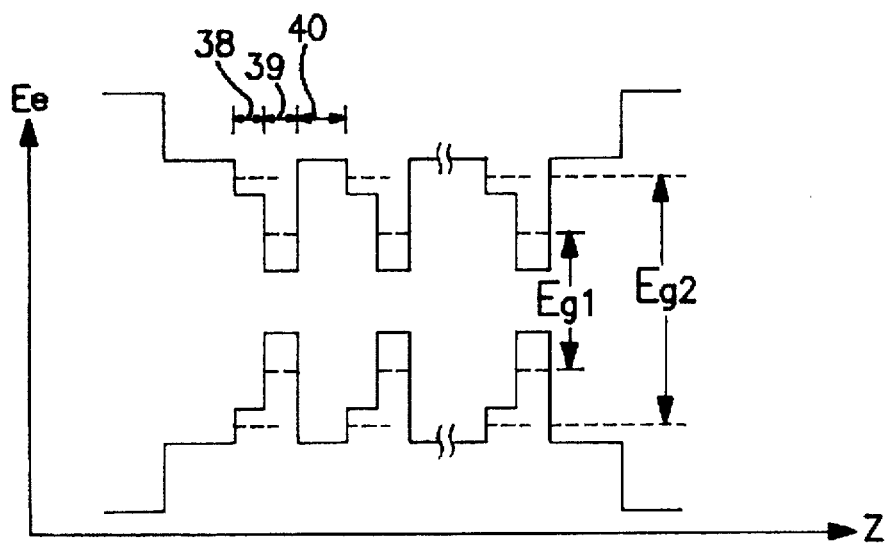

FIG. 10B is a diagram illustrative of an energy band gap profile of a multiple quantum well structure of an active layer in a novel laser diode of FIG. 10A.

Figure 10C:
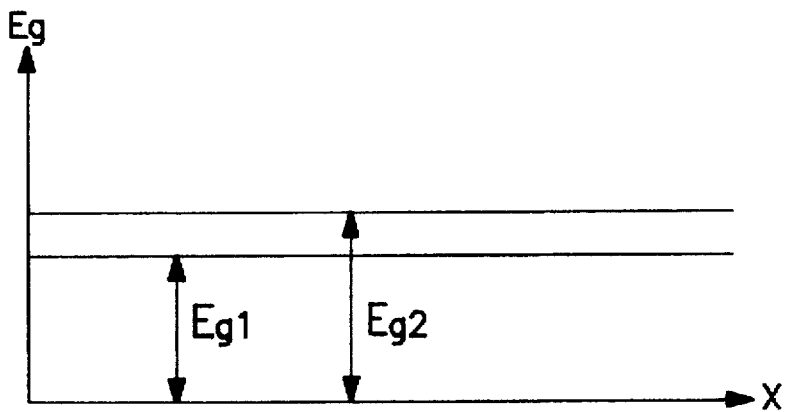

FIG. 10C is a diagram illustrative of energy band gap levels of a multiple quantum well structure in a novel laser diode of FIG. 10A.

Figure 11:
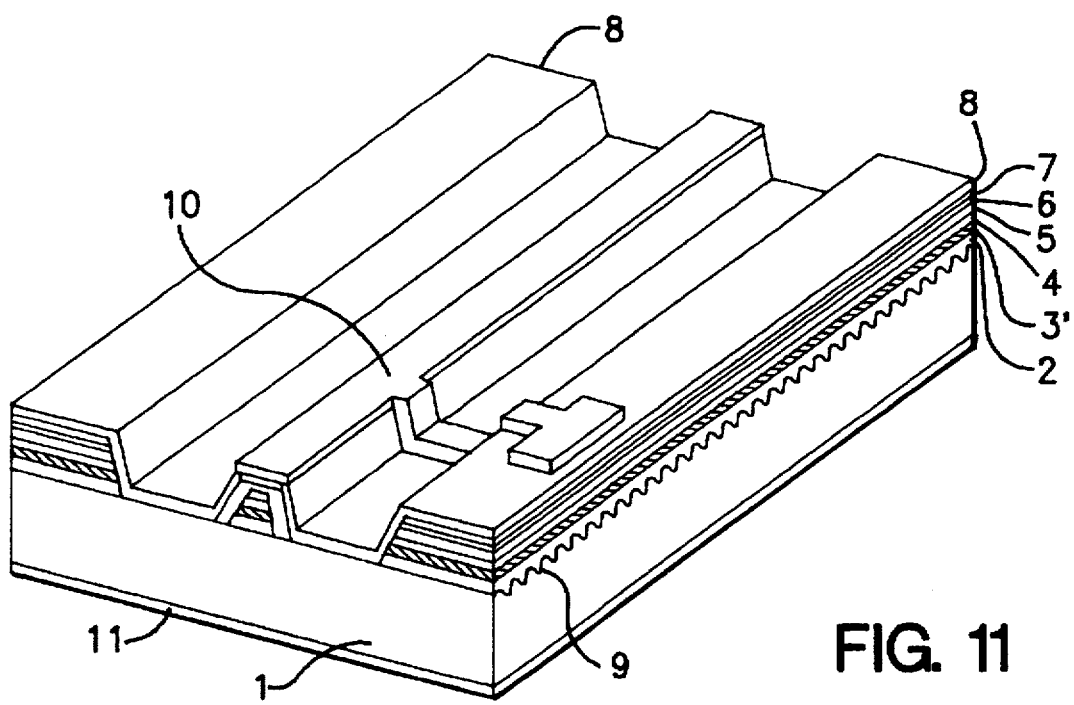

FIG. 11 a squint view illustrative of a novel laser diode in a fourth embodiment according to the present invention.

Figure 12A:
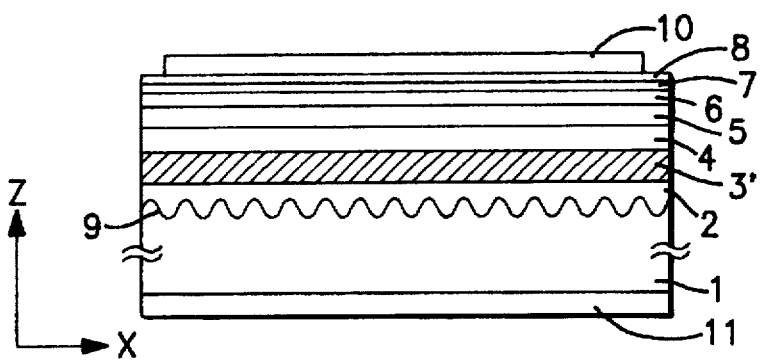

FIG. 12A is a cross sectional elevation view illustrative of a novel laser diode of FIG. 11.

Figure 12B:
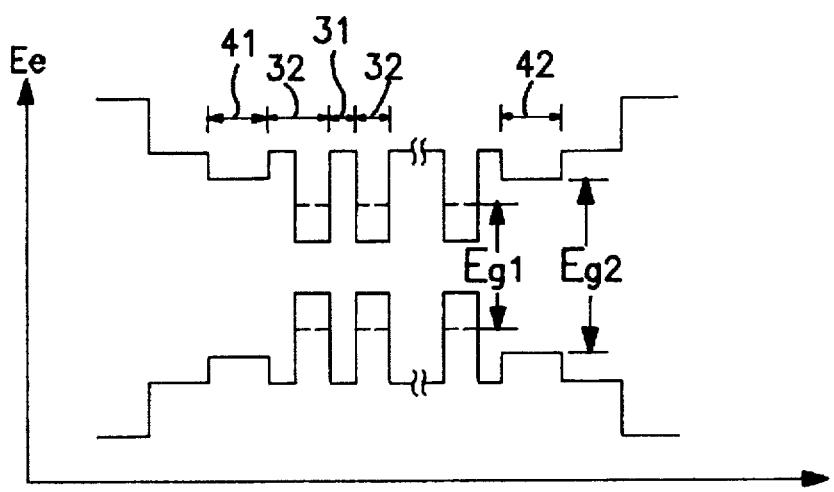

FIG. 12B is a diagram illustrative of an energy band gap profile of a multiple quantum well structure of an active layer in a novel laser diode of FIG. 12A.

Figure 12C:
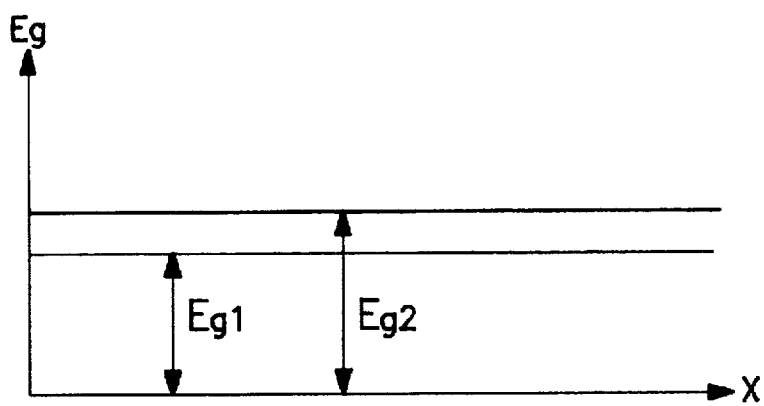

FIG. 12C is a diagram illustrative of energy band gap levels of a multiple quantum well structure in a novel laser diode of FIG. 12A.

Figure 13:
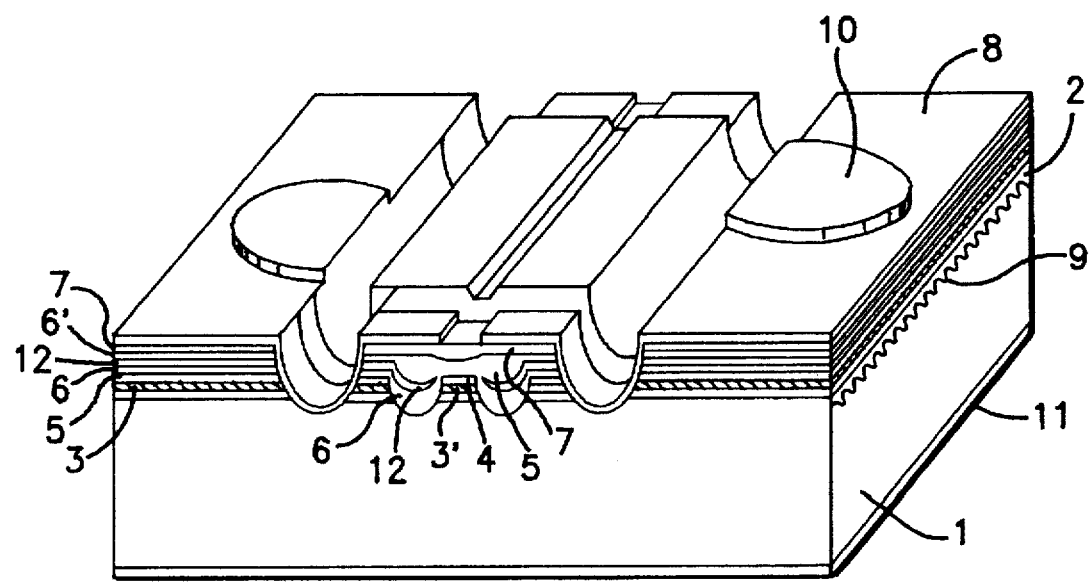

FIG. 13 a squint view illustrative of a novel laser diode in a fifth embodiment according to the present invention.

Figure 14A:
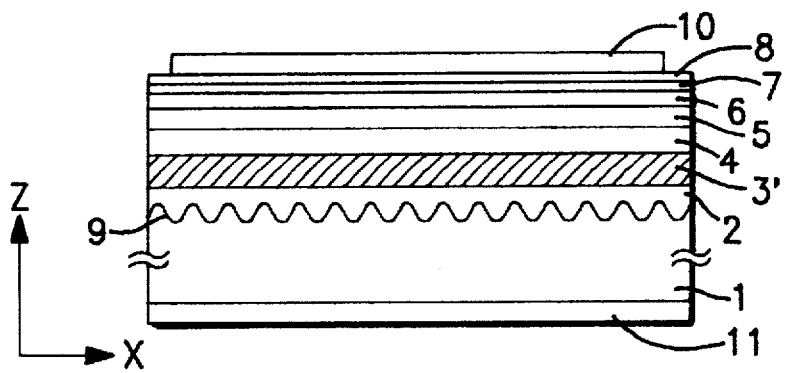

FIG. 14A is a cross sectional elevation view illustrative of a novel laser diode of FIG. 13.

Figure 14B:
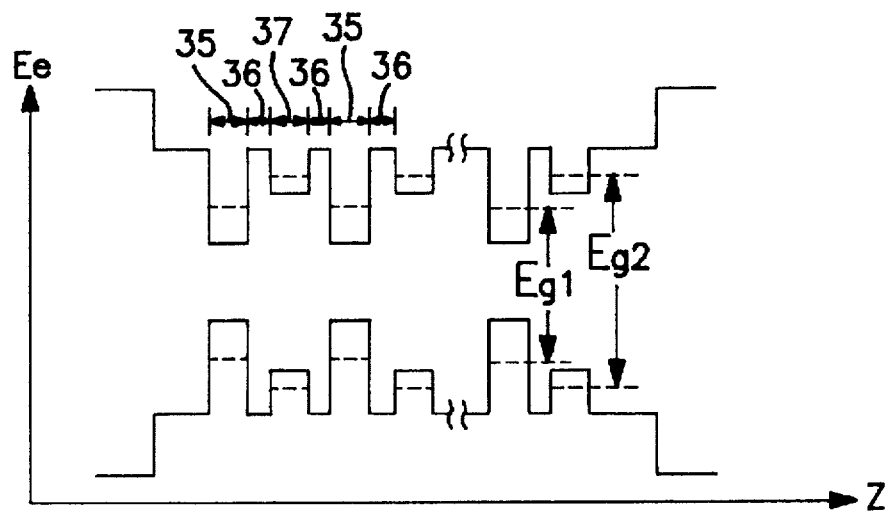

FIG. 14B is a diagram illustrative of an energy band gap profile of a multiple quantum well structure of an active layer in a novel laser diode of FIG. 14A.

Figure 14C:
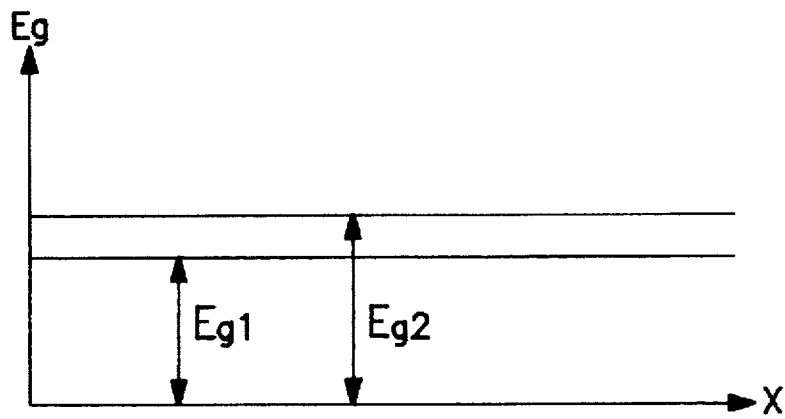

FIG. 14C is a diagram illustrative of energy band gap levels of a multiple quantum well structure in a novel laser diode of FIG. 14A.

Figure 15:
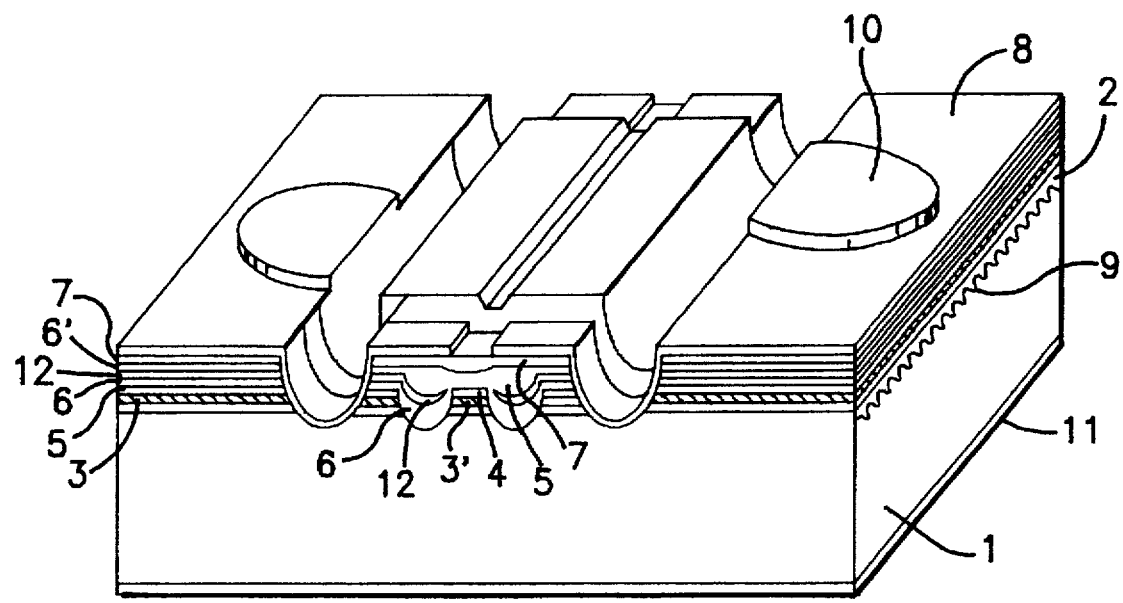

FIG. 15 a squint view illustrative of a novel laser diode in a sixth embodiment according to the present invention.

Figure 16A:
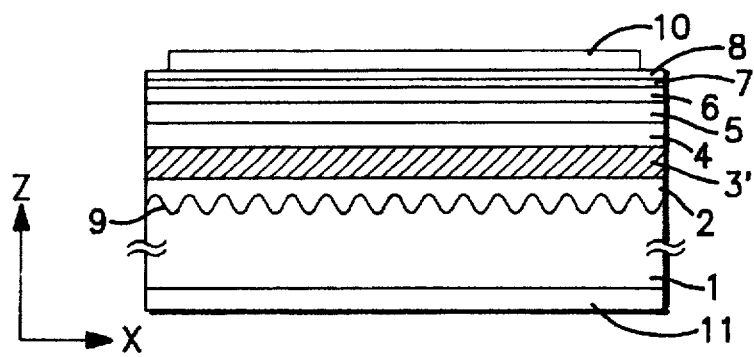

FIG. 16A is a cross sectional elevation view illustrative of a novel laser diode of FIG. 15.

Figure 16B:
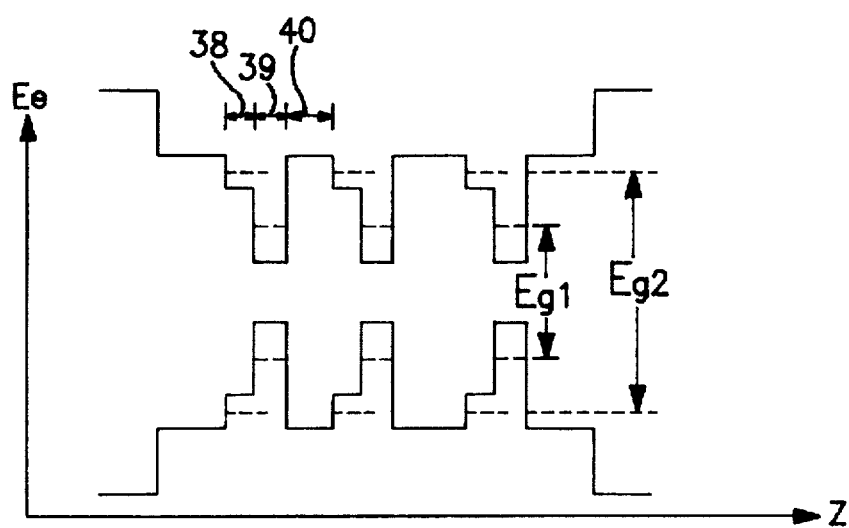

FIG. 16B is a diagram illustrative of an energy band gap profile of a multiple quantum well structure of an active layer in a novel laser diode of FIG. 16A.

Figure 16C:
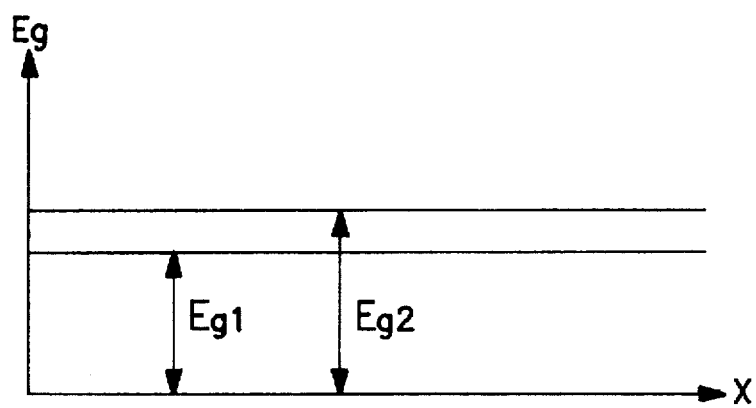

FIG. 16C is a diagram illustrative of energy band gap levels of a multiple quantum well structure in a novel laser diode of FIG. 16A.

Figure 17:
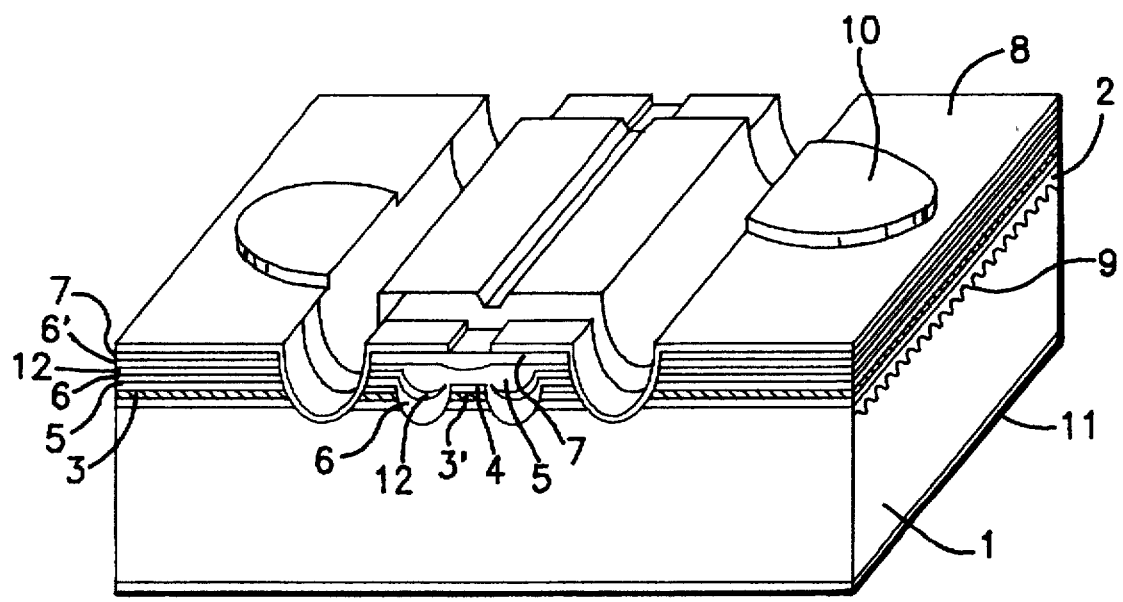

FIG. 17 a squint view illustrative of a novel laser diode in a seventh embodiment according to the present invention.

Figure 18A:
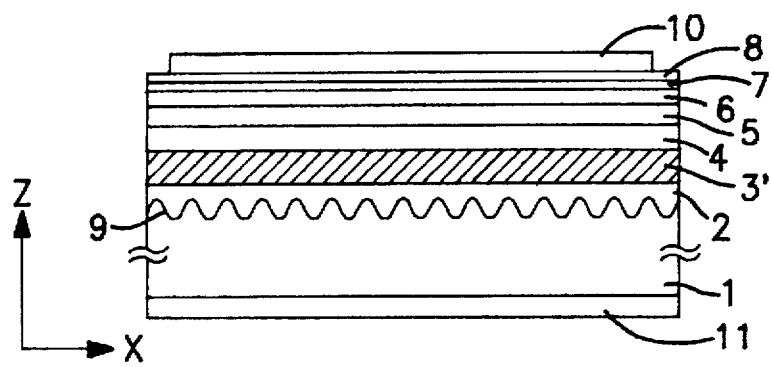

FIG. 18A is a cross sectional elevation view illustrative of a novel laser diode of FIG. 15.

Figure 18B:
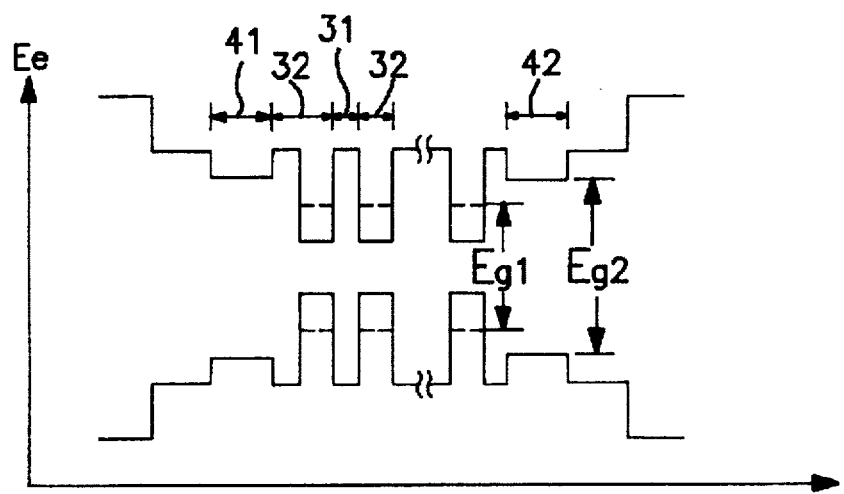

FIG. 18B is a diagram illustrative of an energy band gap profile of a multiple quantum well structure of an active layer in a novel laser diode of FIG. 18A.

Figure 18C:
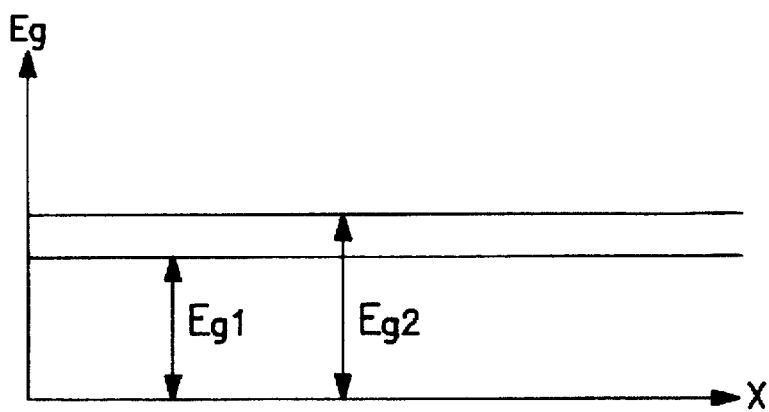

FIG. 18C is a diagram illustrative of energy band gap levels of a multiple quantum well structure in a novel laser diode of FIG. 18A.

DISCLOSURE OF THE INVENTION

The present invention provides an active layer structure provided in a light emission device for emitting a light with a predetermined wavelength. The active layer structure comprises an electroluminescence section and a carrier accumulation section in alignment with the electroluminescence section. The electroluminescence section comprises a first multiple quantum well structure comprising alternating laminations of first well layers showing electroluminescence and first potential barrier layers. The first well layers have a first set of energy band gaps which are uniform and correspond to the predetermined wavelength. The carrier accumulation section comprises a second multiple quantum well structure comprising alternating laminations of second well layers and second potential barrier layer. An energy band gap is defined as a difference between a ground level of electrons in conduction band and a ground level of holes in valence band. The second well layers have a second set of energy band gaps in a range which is above the first set of energy band gaps and below a set of forbidden band widths of the first potential barrier layers The range of the second set of energy band gaps is defined so that the second well layers exhibit carrier accumulations and no electroluminescence to thereby ensure that carriers accumulated in the second well layers are injected into the first well layers when the first well layers are deficient in carriers for the electroluminescence.

The above well layer, in which carriers are accumulated for injection into the first well layers when the first well layers are deficient in carriers, makes the first well layers free from being deficient in carriers for the electroluminescence. This causes almost no variation in refractive index of a laser medium or a considerable reduction in variation in refractive index of a laser medium. This suppresses an active wavelength chirping.

In the above case, may the first and second well layers and the potential barrier layers vary in forbidden band width and in wavelength composition as well as in thickness, so that every the first well layers have a uniform energy band gap which corresponds to the predetermined wavelength, and further that the second set of energy band gaps is in the range which is above the first set of energy band gaps and below the set of forbidden band widths of the potential barrier layers, where the range of the second set of energy band gaps is defined so that the second well layers exhibit carrier accumulations and no electroluminescence to thereby ensure that carriers accumulated in the second well layer is injected into the first well layers when the first well layers are deficient in carriers for the electroluminescence.

Alternatively, the first well layers may have a uniform forbidden band width and a uniform wavelength composition as well as a uniform thickness. Further, the first potential barrier layers also have a uniform forbidden band width and a uniform wavelength composition as well as a uniform thickness. Furthermore, the second well layers have a uniform forbidden band width and a uniform wavelength composition as well as a uniform thickness. Moreover, the second potential barrier layers also have a uniform forbidden band width and a uniform wavelength composition as well as a uniform thickness.

In the just above alternative case, for example the first well layers may have a wavelength composition of 1.72 micrometers and a thickness of 5.5 nanometers as well as a first energy band gap of 0.80 eV. Further, it may for example be available that the first potential barrier layers have a wavelength composition of 1.15 micrometers and of a thickness 4 micrometers. Furthermore, the second well layers have a wavelength composition of 1.40 micrometers and a thickness of 4.0 nanometers as well as a second energy band gap of 0.82 eV. Moreover, the second potential barrier layers have a wavelength composition of 1.15 micrometers and of a thickness 6 micrometers.

In the just above case, the first well layers are desirably made of +0.8%-strained InGaAs layers. Further, the first potential barrier layers are desirably made of non-strained InGaAs layers. Furthermore, the second well layers are desirably made of +0.6%-strained InGaAs layers. Moreover, the second potential barrier layers are desirably made of −0.2%-strained InGaAs layers.

In the above alternative case, for example the first energy band gap is gradually changed into the second energy band gap.

The present invention also provides a semiconductor laser device including an active layer structure which is provided on an optical guide layer provided on a surface, having a grating structure, of a semiconductor substrate. The active layer structure comprising an electroluminescence section and a carrier accumulation section in alignment with the electroluminescence section. The electroluminescence section comprises a fast multiple quantum well structure comprising alternating laminations of first well layers showing electroluminescence and first potential barrier layers. The first well layers have a first set of a uniform energy band gap which corresponds to the predetermined wavelength. The carrier accumulation section comprises a second multiple quantum well structure comprising alternating laminations of second well layers and second potential barrier layer. An energy band gap is defined as a difference between a ground level of electrons in conduction band and a ground level of holes in valence band. The second well layers have a second set of energy band gaps in a range which is above the first set of energy band gaps and below a set of forbidden band widths of the first potential barrier layers. The range of the second set of energy band gaps is defined so that the second well layers exhibit carrier accumulations and no electroluminescence to thereby ensure that carriers accumulated in the second well layers are injected into the first well layers when the first well layers are deficient in carriers for the electroluminescence.

The above well layer, in which carriers are accumulated for injection into the first well layers when the first well layers are deficient in carriers, makes the first well layers free from being deficient in carriers for the electroluminescence. This causes almost no variation in refractive index of a laser medium or a considerable reduction in variation in refractive index of a laser medium. This suppresses an active wavelength chirping.

In the above case, it may be available that the first and second well layers and the potential barrier layers vary in forbidden band width and in wavelength composition as well as in thickness, so that every the first well layers have a uniform energy band gap which corresponds to the predetermined wavelength, and further so that the second set of energy band gaps is in the range which is above the first set of energy band gaps and below the set of forbidden band widths of the potential barrier layers, where the range of the second set of energy band gaps is defined so that the second well layers exhibit carrier accumulations and no electroluminescence, to thereby ensure that carriers accumulated in the second well layer is injected into the first well layers when the first well layers are deficient in carriers for the electroluminescence.

Alternatively, it may be available that the first well layers have a uniform forbidden band width and a uniform wavelength composition as well as a uniform thickness. Further, the first potential barrier layers also have a uniform forbidden band width and a uniform wavelength composition as well as a uniform thickness. Furthermore, the second well layers have a uniform forbidden band width and a uniform wavelength composition as well as a uniform thickness. Moreover, the second potential barrier layers also have a uniform forbidden band width and a uniform wavelength composition as well as a uniform thickness.

In the just above alternative case, it may be available that the first well layers have a wavelength composition of 1.72 micrometers and a thickness of 5.5 nanometers as well as a first energy band gap of 0.80 eV. Further, the first potential barrier layers have a wavelength composition of 1.15 micrometers and of a thickness 4 micrometers. Furthermore, the second well layers have a wavelength composition of 1.40 micrometers and a thickness of 4.0 nanometers as well as a second energy band gap of 0.82 eV. Moreover, the second potential barrier layers have a wavelength composition of 1.15 micrometers and of a thickness 6 micrometers.

In the just above case, it may more concretely be available that the first well layers are made of +0.8%-strained InGaAs layers. Further, the first potential barrier layers are made of non-strained InGaAs layers. Furthermore, the second well layers are made of +0.6%-strained InGaAs layers. Moreover, the second potential barrier layers are made of −0.2%-strained InGaAs layers.

Additionally, it may preferably be available that the first energy band gap is gradually changed into the second energy band gap.

The present invention provides another active layer structure provided in a light emission device for emitting a light with a predetermined wavelength. The active layer structure comprises a multiple quantum well structure and at least a second well layer. The multiple quantum well structure comprises alternating laminations of first well layers showing electroluminescence and potential barrier layers. The first well layers have a first set of energy band gaps which are uniform and corresponds to the predetermined wavelength, provided that energy band gap is defined as a difference between a ground level of electrons in conduction band and a ground level of holes in valence band. The second well layer is provided within any of the potential barrier layers so that the second well layer is separated via the potential barrier layers from the first well layers. The second well layer has a second energy band gap in a range which is above the first set of energy band gaps and below a set of forbidden band widths of the potential barrier layers. The range of the second energy band gaps is defined so that the second well layer exhibits carrier accumulations and no electro-luminescence to thereby ensure that carriers accumulated in the second well layer are injected into the first well layers when the first well layers are deficient in carriers for the electro-luminescence.

The above well layer, in which carriers are accumulated for injection into the first well layers when the first well layers are deficient in carriers, makes the first well layers free from being deficient in carriers for the electro-luminescence. This causes almost no variation in refractive index of a laser medium or a considerable reduction in variation in refractive index of a laser medium. This suppresses an active wavelength chirping.

In the above case, it may be available that the second well layers are provided within every the potential barrier layers. Further, the second well layers have a second set of energy band gaps in the range which is above the first set of energy band gaps and below a set of forbidden band widths of the potential barrier layers. Furthermore, the range of the second set of energy band gaps is defined so that the second well layer exhibits carrier accumulations and no electro-luminescence to thereby ensure that carriers accumulated in the second well layer are injected into the first well layers when the first well layers are deficient in carriers for the electroluminescence.

Alternatively, it may optionally be available to further provide at least a third well layer on any interface of the first well layers and the potential barrier layers so that the third well layer is sandwiched between the first well layer and the potential barrier layer. The third well layer has a third energy band gap in the range which is above the first set of energy band gaps and below the set of forbidden band widths of the potential barrier layers. The range of the third energy band gap is defined so that the third well layer exhibits carrier accumulations and no electro-luminescence to thereby ensure that carriers accumulated in the third well layer are injected into the first well layers when the first well layers are deficient in carriers for the electroluminescence.

In the just above alternative case, it may preferably available that the third well layers are provided to be sandwiched by every combinations of the first well layers and the potential barrier layers so that every the first well layers are sandwiched between the third well layers and the potential barrier layers. Further, the third well layers have a third set of energy band gaps in the range which is above the first set of energy band gaps and below the set of forbidden band widths of the potential barrier layers. Furthermore, the range of the third set of energy band gaps is defined so that the third well layer exhibits carrier accumulations and no electro-luminescence to thereby ensure that carriers accumulated in the third well layer are injected into the first well layers when the first well layers are deficient in carriers for the electro-luminescence.

Further alternatively, it may optionally be available to further provide at least a third well layer being provided on any interface of the first well layers and the potential barrier layers so that the third well layer is sandwiched between the first well layer and the potential barrier layer. The third well layer has a third energy band gap in the range which is above the first set of energy band gaps and below the set of forbidden band widths of the potential barrier layers. The range of the third energy band gap is defined so that the third well layer exhibits carrier accumulations and no electroluminescence to thereby ensure that carriers accumulated in the third well layer are injected into the first well layers when the first well layers are deficient in carriers for the electro-luminescence.

In the just above further alternative case, it may preferably available that the third well layers are provided to be sandwiched by every combinations of the first well layers and the potential barrier layers so that every the first well layers are sandwiched between the third well layers and the potential barrier layers. Further, the third well layers have a third set of energy band gaps in the range which is above the first set of energy band gaps and below the set of forbidden band widths of the potential barrier layers. Furthermore, the range of the third set of energy band gaps is defined so that the third well layer exhibits carrier accumulations and no electroluminescence to thereby ensure that carriers accumulated in the third well layer are injected into the first well layers when the first well layers are deficient in carriers for the electro-luminescence.

In the above alternative case, it may preferably available that the third well layers are provided within every the interfaces of the first well layers and the potential barrier layers so that every the first well layers are sandwiched by the third well layers. The third well layers have a third set of energy band gaps in the range which is above the first set of energy band gaps and below the set of forbidden band widths of the potential barrier layers. The range of the second set of energy band gaps is defined so that the third well layer exhibits carrier accumulations and no electroluminescence to thereby ensure that carriers accumulated in the third well layer are injected into the first well layers when the first well layers are deficient in carriers for the electro-luminescence.

In the above further alternative case, it may preferably available that the third well layers are provided within every the interfaces of the first well layers and the potential barrier layers so that every the first well layers are sandwiched by the third well layers. The third well layers have a third set of energy band gaps in the range which is above the first set of energy band gaps and below the set of forbidden band widths of the potential barrier layers. The range of the second set of energy band gaps is defined so that the third well layer exhibits carrier accumulations and no electro-luminescence to thereby ensure that carriers accumulated in the third well layer are injected into the first well layers when the first well layers are deficient in carriers for the electro-luminescence.

Still further alternatively, it may optionally be available to further provide at least a fourth well layer at any side of the multiple quantum well structure so that the fourth well layer is separated via the potential barrier layers from the first well layers. The fourth well layer has a fourth energy band gap in the range which is above the first set of energy band gaps and below the set of forbidden band widths of the potential barrier layers. The range of the second energy band gap is defined so that the fourth well layer exhibits carrier accumulations and no electro-luminescence to thereby ensure that carriers accumulated in the fourth well layer are injected into the first well layers when the first well layers are deficient in carriers for the electroluminescence.

In the just above still further alternative case, it may preferably available that the fourth well layers are provided at opposite sides of the multiple quantum well structure so that the multiple quantum well structure is positioned between the fourth well layers.

Still more alternatively, it may optionally be available to further provide at least a fourth well layer being provided at any side of the multiple quantum well structure so that the fourth well layer is separated via the potential barrier layers from the first well layers. The fourth well layer has a fourth energy band gap in the range which is above the first set of energy band gaps and below the set of forbidden band widths of the potential barrier layers. The range of the second energy band gap is defined so that the fourth well layer exhibits carrier accumulations and no electro-luminescence to thereby ensure that carriers accumulated in the fourth well layer are injected into the first well layers when the first well layers are deficient in carriers for the electro-luminescence.

In the just above still more alternative case, it may preferably available that the fourth well layers are provided at opposite sides of the multiple quantum well structure so that the multiple quantum well structure is positioned between the fourth well layers.

Yet further alternatively, it may be available that the first and second well layers and the potential barrier layers vary in forbidden band width and in wavelength composition as well as in thickness, so that every the first well layers have a uniform energy band gap which corresponds to the predetermined wavelength, and further so that the second energy band gap is in the range which is above the first set of energy band gaps and below the set of forbidden band widths of the potential barrier layers. The range of the second energy band gap is defined so that the second well layer exhibits carrier accumulations and no electro-luminescence. This ensures that carriers accumulated in the second well layer is injected into the first well layers when the first well layers are deficient in carriers for the electroluminescence.

In the above alternative case, it may also be available that the first and second well layers and the potential barrier layers vary in forbidden band width and in wavelength composition as well as in thickness, so that every the first well layers have a uniform energy band gap which corresponds to the predetermined wavelength, and further so that the second set of energy band gaps is in the range which is above the first set of energy band gaps and below the set of forbidden band widths of the potential barrier layers. The range of the second set of energy band gaps is defined so that the second well layers exhibit carrier accumulations and no electro-luminescence. This ensures that carriers accumulated in the second well layer is injected into the first well layers when the first well layers are deficient in carriers for the electro-luminescence.

Still moreover alternatively, it may be available that the first well layers have a uniform forbidden band width and a uniform wavelength composition as well as a uniform thickness. The potential barrier layers also have a uniform forbidden band width and a uniform wavelength composition as well as a uniform thickness.

Again, in the above alternative case, it may also be available that the first well layers have a uniform forbidden band width and a uniform wavelength composition as well as a uniform thickness. The potential barrier layers also have a uniform forbidden band width and a uniform wavelength composition as well as a uniform thickness. The second well layers have a uniform forbidden band width and a uniform wavelength composition as well as a uniform thickness.

Yet moreover alternatively, it may for example be available that the first well layers have a wavelength composition of 1.67 micrometers and a thickness of 5.0 nanometers as well as a first energy band gap of 0.80 eV. Further, the potential barrier layers have a wavelength composition of 1.15 micrometers and of a thickness 3 micrometers. Furthermore, the second well layer has a wavelength composition of 1.40 micrometers and a thickness of 4.0 nanometers as well as a second energy band gap of 1.00 eV.

In the just above yet moreover alternative case, the first well layers are made of +0.6%-strained InGaAs layers. The potential barrier layers are made of non-strained InGaAs layers. The second well layer is made of a non-strained InGaAs layer.

The present invention also provides another semiconductor laser device including an active layer structure which is provided on an optical guide layer provided on a surface, having a gating structure, of a semiconductor substrate. The active layer structure comprises a multiple quantum well structure and a multiple quantum well structure. The multiple quantum well structure comprises alternating laminations of first well layers showing electroluminescence and potential barrier layers. The first well layers have a first set of energy band gaps which are uniform and corresponds to the predetermined wavelength, provided that energy band gap is defined as a difference between a ground level of electrons in conduction band and a ground level of holes in valence band. The multiple quantum well structure is provided within any of the potential barrier layers so that the second well layer is separated via the potential barrier layers from the first well layers. The second well layer has a second energy band gap in a range which is above the first set of energy band gaps and below a set of forbidden band widths of the potential barrier layers. The range of the second energy band gaps is defined so that the second well layer exhibits carrier accumulations and no electro-luminescence to thereby ensure that carriers accumulated in the second well layer are injected into the first well layers when the first well layers are deficient in carriers for the electroluminescence.

The above well layer, in which carriers are accumulated for injection into the first well layers when the first well layers are deficient in carriers, makes the first well layers free from being deficient in carriers for the electro-luminescence. This causes almost no variation in refractive index of a laser medium or a considerable reduction in variation in refractive index of a laser medium. This suppresses an active wavelength chirping.

In the above case, it may preferably be available that the second well layers are provided within every the potential barrier layers. The second well layers have a second set of energy band gaps in the range which is above the first set of energy band gaps and below a set of forbidden band widths of the potential barrier layers. The range of the second set of energy band gaps is defined so that the second well layer exhibits carrier accumulations and no electro-luminescence. This ensures that carriers accumulated in the second well layer are injected into the first well layers when the first well layers are deficient in carriers for the electro-luminescence.

Alternatively, it may also be available that the first and second well layers and the potential barrier layers vary in forbidden band width and in wavelength composition as well as in thickness, so that every the first well layers have a uniform energy band gap which corresponds to the predetermined wavelength, and further so that the second energy band gap is in the range which is above the first set of energy band gaps and below the set of forbidden band widths of the potential barrier layers. The range of the second energy band gap is defined so that the second well layer exhibits carrier accumulations and no electro-luminescence. This ensures that carriers accumulated in the second well layer is injected into the first well layers when the first well layers are deficient in carriers for the electroluminescence.

In the above preferable case, it may be available that the first and second well layers and the potential barrier layers vary in forbidden band width and in wavelength composition as well as in thickness, so that every the first well layers have a uniform energy band gap which corresponds to the predetermined wavelength, and further so that the second set of energy band gaps is in the range which is above the first set of energy band gaps and below the set of forbidden band widths of the potential barrier layers. The range of the second set of energy band gaps is defined so that the second well layers exhibit carrier accumulations and no electro-luminescence. This ensures that carriers accumulated in the second well layer is injected into the first well layers when the first well layers are deficient in carriers for the electro-luminescence.

Further alternatively, it may also be available that the first well layers have a uniform forbidden band width and a uniform wavelength composition as well as a uniform thickness. The potential barrier layers also have a uniform forbidden band width and a uniform wavelength composition as well as a uniform thickness.

In the above preferable case, it may more preferably that the first well layers have a uniform forbidden band width and a uniform wavelength composition as well as a uniform thickness. The potential barrier layers also have a uniform forbidden band width and a uniform wavelength composition as well as a uniform thickness. The second well layers have a uniform forbidden band width and a uniform wavelength composition as well as a uniform thickness.

Moreover alternatively, it may for example be available that the first well layers have a wavelength composition of 1.67 micrometers and a thickness of 5.0 nanometers as well as a first energy band gap of 0.80 eV. Further, the potential barrier layers have a wavelength composition of 1.15 micrometers and of a thickness 3 micrometers. Furthermore, the second well layer has a wavelength composition of 1.40 micrometers and a thickness of 4.0 nanometers as well as a second energy band gap of 1.00 eV.

In the just above moreover alternative case, it may more concretely be available that the first well layers are made of +0.6%-strained InGaAs layers. Further, the potential barrier layers are made of non-strained InGaAs layers. Furthermore, the second well layer is made of a non-strained InGaAs layer.

The present invention provides still another active layer structure provided in a light emission device for emitting a light with a predetermined wavelength. The active layer structure comprises a multiple quantum well structure and at least a second well layer. The multiple quantum well structure comprises alternating laminations of first well layers showing electroluminescence and potential barrier layers. The first well layers have a first set of energy band gaps which are uniform and corresponds to the predetermined wavelength, provided that energy band gap is defined as a difference between a ground level of electrons in conduction band and a ground level of holes in valence band. The second well layer is provided on any interface of the first well layers and the potential barrier layers so that the second well layer is sandwiched between the first well layer and the potential barrier layer. The second well layer has a second energy band gap in a range which is above the first set of energy band gaps and below a set of forbidden band widths of the potential barrier layers. The range of the second energy band gap is defined so that the second well layer exhibits carrier accumulations and no electro-luminescence. This ensures that carriers accumulated in the second well layer are injected into the first well layers when the first well layers are deficient in carriers for the electroluminescence.

The above well layer, in which carriers are accumulated for injection into the first well layers when the first well layers are deficient in carriers, makes the first well layers free from being deficient in carriers for the electro-luminescence. This causes almost no variation in refractive index of a laser medium or a considerable reduction in variation in refractive index of a laser medium. This suppresses an active wavelength chirping.

It is preferably available that the second well layers are provided to be sandwiched by every combinations of the first well layers and the potential barrier layers so that every the first well layers are sandwiched between the second well layers and the potential barrier layers. The second well layers have a second set of energy band gaps in the range which is above the first set of energy band gaps and below the set of forbidden band widths of the potential barrier layers. The range of the second set of energy band gaps is defined so that the second well layer exhibits carrier accumulations and no electro-luminescence. This ensures that carriers accumulated in the second well layer are injected into the first well layers when the first well layers are deficient in carriers for the electroluminescence.

Alternatively, it may be also available that the second well layers are provided within every the interfaces of the first well layers and the potential barrier layers so that every the first well layers are sandwiched by the second well layers. The second well layers have a second set of energy band gaps in the range which is above the first set of energy band gaps and below the set of forbidden band widths of the potential barrier layers. The range of the second set of energy band gaps is defined so that the second well layer exhibits carrier accumulations and no electro-luminescence. This ensures that carriers accumulated in the second well layer are injected into the first well layers when the first well layers are deficient in carriers for the electroluminescence.

Further alternatively, it may also be available to further provide at least a third well layer within any of the potential barrier layers so that the third well layer is separated via the potential barrier layers from the first well layers. The third well layer has a third energy band gap in the range which is above the first set of energy band gaps and below the set of forbidden band widths of the potential barrier layers. The range of the third energy band gap is defined so that the third well layer exhibits carrier accumulations and no electro-luminescence. This ensures that carriers accumulated in the third well layer are injected into the first well layers when the first well layers are deficient in carriers for the electro-luminescence.

In the just above further alternative case, it may preferably be available that the third well layers are provided within every the potential barrier layers. The third well layers have a third set of energy band gaps in the range which is above the first set of energy band gaps and below the set of forbidden band widths of the potential barrier layers. The range of the third set of energy band gaps is defined so that the third well layer exhibits carrier accumulations and no electro-luminescence. This ensures that carriers accumulated in the third well layer are injected into the first well layers when the first well layers are deficient in carriers for the electro-luminescence.

Still further alternatively, it may also be available to further provide at least a third well layer being provided within any of the potential barrier layers so that third well layer is separated via the potential barrier layers from the first well layers. The third well layer has a third energy band gap in the range which is above the first set of energy band gaps and below the set of forbidden band widths of the potential barrier layers. The range of the third energy band gap is defined so that the third well layer exhibits carrier accumulations and no electro-luminescence. This ensures that carriers accumulated in the third well layer are injected into the first well layers when the first well layers are deficient in carriers for the electro-luminescence.

In the just above still further alternative case, it may preferably be available that the third well layers are provided within every the potential barrier layers. The third well layers have a third set of energy band gaps in the range which is above the first set of energy band gaps and below the set of forbidden band widths of the potential barrier layers. The range of the third set of energy band gaps is defined so that the third well layer exhibits carrier accumulations and no electro-luminescence. This ensures that carriers accumulated in the third well layer are injected into the first well layers when the first well layers are deficient in carriers for the electro-luminescence.

Yet further alternatively, it may also be available to further provide at least a third well layer being provided within any of the potential barrier layers so that the third well layer is separated via the potential barrier layers from the first well layers. The third well layer has a third energy band gap in the range which is above the first set of energy band gaps and below the set of forbidden band widths of the potential barrier layers. The range of the third energy band gap is defined so that the third well layer exhibits carrier accumulations and no electro-luminescence. This ensures that carriers accumulated in the third well layer are injected into the first well layers when the first well layers are deficient in carriers for the electro-luminescence.

In the just above yet further alternative case, it may preferably be available that the third well layers are provided within every the potential barrier layers. The third well layers have a third set of energy band gaps in the range which is above the first set of energy band gaps and below the set of forbidden band widths of the potential barrier layers. The range of the third set of energy band gaps is defined so that the third well layer exhibits carrier accumulations and no electro-luminescence. This ensures that carriers accumulated in the third well layer are injected into the first well layers when the first well layers are deficient in carriers for the electro-luminescence.

Still more alternatively, it may also be available to further provide at least a fourth well layer being provided at any side of the multiple quantum well structure so that the fourth well layer is separated via the potential barrier layers from the first well layers. The fourth well layer has a fourth energy band gap in the range which is above the first set of energy band gaps and below the set of forbidden band widths of the potential barrier layers. The range of the second energy band gap is defined so that the fourth well layer exhibits carrier accumulations and no electro-luminescence. This ensures that carriers accumulated in the fourth well layer are injected into the first well layers when the first well layers are deficient in carriers for the electro-luminescence.

In the just above still more alternative case, it may preferably be available that the fourth well layers are provided at opposite sides of the multiple quantum well structure so that the multiple quantum well structure is positioned between the fourth well layers.

Further more alternatively, it may also be available to further provide at least a fourth well layer being provided at any side of the multiple quantum well structure so that the fourth well layer is separated via the potential barrier layers from the first well layers. The fourth well layer has a fourth energy band gap in the range which is above the first set of energy band gaps and below the set of forbidden band widths of the potential barrier layers. The range of the second energy band gap is defined so that the fourth well layer exhibits carrier accumulations and no electro-luminescence. This ensures that carriers accumulated in the fourth well layer are injected into the first well layers when the first well layers are deficient in carriers for the electro-luminescence.

In the just above her more alternative case, it may preferably be available that the fourth well layers are provided at opposite sides of the multiple quantum well structure so that the multiple quantum well structure is positioned between the fourth well layers.

Moreover, alternatively, it may also be available that the first and second well layers and the potential barrier layers vary in forbidden band width and in wavelength composition as well as in thickness, so that every the first well layers have a uniform energy band gap which corresponds to the predetermined wavelength, and further so that the second energy band gap is in the range which is above the first set of energy band gaps and below the set of forbidden band widths of the potential barrier layers. The range of the second energy band gap is defined so that the second well layer exhibits carrier accumulations and no electro-luminescence. This ensures that carriers accumulated in the second well layer is injected into the first well layers when the first well layers are deficient in carriers for the electroluminescence.

In the above preferable case, it may also be available that the first and second well layers and the potential barrier layers vary in forbidden band width and in wavelength composition as well as in thickness, so that every the first well layers have a uniform energy band gap which corresponds to the predetermined wavelength, and further so that the second set of energy band gaps is in the range which is above the first set of energy band gaps and below the set of forbidden band widths of the potential barrier layers. The range of the second set of energy band gaps is defined so that the second well layers exhibit carrier accumulations and no electro-luminescence. This ensures that carriers accumulated in the second well layer is injected into the first well layers when the first well layers are deficient in carriers for the electro-luminescence.

Still moreover, alternatively, it may also be available that the first well layers have a uniform forbidden band width and a uniform wavelength composition as well as a uniform thickness. The potential barrier layers also have a uniform forbidden band width and a uniform wavelength composition as well as a uniform thickness.

In the above preferable case, it may also be available that the first well layers have a uniform forbidden band width and a uniform wavelength composition as well as a uniform thickness. The potential barrier layers also have a uniform forbidden band width and a uniform wavelength composition as well as a uniform thickness. The second well layers have a uniform forbidden band width and a uniform wavelength composition as well as a uniform thickness.

Preferably, it may for example be available that the first well layers have a wavelength composition of 1.67 micrometers and a thickness of 4.5 nanometers as well as a first energy band gap of 0.80 eV. Further, the potential barrier layers have a wavelength composition of 1.15 micrometers and of a thickness 4 micrometers. Furthermore, the second well layer has a wavelength composition of 1.30 micrometers and a thickness of 6.0 nanometers as well as a second energy band gap of 1.00 eV.

In the just above preferable case, it may more concretely be available that the first well layers are made of +0.6%-strained InGaAs layers. Further, the potential barrier layers are made of non-strained InGaAs layers. Furthermore, the second well layer is made of a non-strained InGaAs layer.

The present invention also provides still another semiconductor laser device including an active layer structure which is provided on an optical guide layer provided on a surface, having a grating structure, of a semiconductor substrate. The active layer structure comprises a multiple quantum well structure and at least a second well layer. The multiple quantum well structure comprises alternating laminations of first well layers showing electroluminescence and potential barrier layers. The first well layers have a first set of energy band gaps which are uniform and corresponds to the predetermined wavelength, provided that energy band gap is defined as a difference between a ground level of electrons in conduction band and a ground level of holes in valence band. The second well layer is provided on any interface of the first well layers and the potential barrier layers so that the second well layer is sandwiched between the first well layer and the potential barrier layer. The second well layer has a second energy band gap in a range which is above the first set of energy band gaps and below a set of forbidden band widths of the potential barrier layers. The range of the second energy band gap is defined so that the second well layer exhibits carrier accumulations and no electro-luminescence. This ensures that carriers accumulated in the second well layer are injected into the first well layers when the first well layers are deficient in carriers for the electroluminescence.

The above well layer, in which carriers are accumulated for injection into the first well layers when the first well layers are deficient in carriers, makes the first well layers free from being deficient in carriers for the electro-luminescence. This causes almost no variation in refractive index of a laser medium or a considerable reduction in variation in refractive index of a laser medium. This suppresses an active wavelength chirping.

In the just above case, it may preferably be available that the second well layers are provided to be sandwiched by every combinations of the first well layers and the potential barrier layers so that every the first well layers are sandwiched between the second well layers and the potential barrier layers. The second well layers have a second set of energy band gaps in the range which is above the first set of energy band gaps and below the set of forbidden band widths of the potential barrier layers. The range of the second set of energy band gaps is defined so that the second well layer exhibits carrier accumulations and no electro-luminescence. This ensures that carriers accumulated in the second well layer are injected into the first well layers when the first well layers are deficient in carriers for the electroluminescence.

Alternatively, it may also be available that the second well layers are provided within every the interfaces of the first well layers and the potential barrier layers so that every the first well layers are sandwiched by the second well layers. The second well layers have a second set of energy band gaps in the range which is above the first set of energy band gaps and below the set of forbidden band widths of the potential barrier layers. The range of the second set of energy band gaps is defined so that the second well layer exhibits carrier accumulations and no electro-luminescence. This ensures that carriers accumulated in the second well layer are injected into the first well layers when the first well layers are deficient in carriers for the electroluminescence.

Yet alternatively, it may be available that the first and second well layers and the potential barrier layers vary in forbidden band width and in wavelength composition as well as in thickness, so that every the first well layers have a uniform energy band gap which corresponds to the predetermined wavelength, and further so that the second energy band gap is in the range which is above the first set of energy band gaps and below the set of forbidden band widths of the potential barrier layers. The range of the second energy band gap is defined so that the second well layer exhibits carrier accumulations and no electro-luminescence. This ensures that carriers accumulated in the second well layer is injected into the first well layers when the first well layers are deficient in carriers for the electroluminescence.

Still alternatively, it may be available that the first and second well layers and the potential barrier layers vary in forbidden band width and in wavelength composition as well as in thickness, so that every the first well layers have a uniform energy band gap which corresponds to the predetermined wavelength, and further so that the second set of energy band gaps is in the range which is above the first set of energy band gaps and below the set of forbidden band widths of the potential barrier layers. The range of the second set of energy band gaps is defined so that the second well layers exhibit carrier accumulations and no electro-luminescence. This ensures that carriers accumulated in the second well layer is injected into the first well layers when the first well layers are deficient in carriers for the electro-luminescence.

Still more alternatively, it may be available that the first well layers have a uniform forbidden band width and a uniform wavelength composition as well as a uniform thickness. The potential barrier layers also have a uniform forbidden band width and a uniform wavelength composition as well as a uniform thickness.

In the above preferable case, it may further be available that the first well layers have a uniform forbidden band width and a uniform wavelength composition as well as a uniform thickness. The potential barrier layers also have a uniform forbidden band width and a uniform wavelength composition as well as a uniform thickness. The second well layers have a uniform forbidden band width and a uniform wavelength composition as well as a uniform thickness.

Moreover alternatively, it may for example be available that the first well layers have a wavelength composition of 1.67 micrometers and a thickness of 4.5 nanometers as well as a first energy band gap of 0.80 eV. The potential barrier layers have a wavelength composition of 1.15 micrometers and of a thickness 4 micrometers. The second well layer has a wavelength composition of 1.30 micrometers and a thickness of 6.0 nanometers as well as a second energy band gap of 1.00 eV.

In the just above moreover alternative case, it may more concretely be available that the first well layers are made of +0.6%-strained InGaAs layers. Further, the potential barrier layers are made of non-strained InGaAs layers. Furthermore, the second well layer is made of a non-strained InGaAs layer.

The present invention also provides yet another active layer structure provided in a light emission device for emitting a light with a predetermined wavelength. The active layer structure comprises a multiple quantum well structure and at least a second well layer. The multiple quantum well structure comprises alternating laminations of first well layers showing electroluminescence and potential barrier layers. The first well layers have a first set of energy band gaps which are uniform and corresponds to the predetermined wavelength, provided that energy band gap is defined as a difference between a ground level of electrons in conduction band and a ground level of holes in valence band. The second well layer is provided at any side of the multiple quantum well structure so that the second well layer is separated via the potential barrier layers from the, first well layers. The second well layer has a second energy band gap in a range which is above the first set of energy band gaps and below a set of forbidden band widths of the potential barrier layers. The range of the second energy band gap is defined so that the second well layer exhibits carrier accumulations and no electro-luminescence. This ensures that carriers accumulated in the second well layer are injected into the first well layers when the first well layers are deficient in carriers for the electro-luminescence.

The above well layer, in which carriers are accumulated for injection into the first well layers when the first well layers are deficient in carriers, makes the first well layers free from being deficient in carriers for the electro-luminescence. This causes almost no variation in refractive index of a laser medium or a considerable reduction in variation in refractive index of a laser medium. This suppresses an active wavelength chirping.

In the above case, it may preferably be available that the second well layers are provided at opposite sides of the multiple quantum well structure so that the multiple quantum well structure is positioned between the second well layers.

Alternatively, it may optionally be available to further provide at least a third well layer within any of the potential barrier layers so that the third well layer is separated via the potential barrier layers from the first well layers. The third well layer has a, second energy band gap in a range which is above the first set of energy band gaps and below the set of forbidden band widths of the potential barrier layers. The range of the third energy band gaps is defined so that the third well layer exhibits carrier accumulations and no electro-luminescence. This ensures that carriers accumulated in the third well layer are injected into the first well layers when the first well layers are deficient in carriers for the electro-luminescence.

In the just above alternative case, it may be available that the third well layers are provided within every the potential barrier layers. The third well layers have a second set of energy band gaps in the range which is above the first set of energy band gaps and below the set of forbidden band widths of the potential barrier layers. The range of the third set of energy band gaps is defined so that the third well layer exhibits carrier accumulations and no electro-luminescence. This ensures that carriers accumulated in the third well layer are injected into the first well layers when the first well layers are deficient in carriers for the electroluminescence.

Further alternatively, it may optionally be available to further provide at least a third well layer being provided within any of the potential barrier layers so that the third well layer is separated via the potential barrier layers from the first well layers. The third well layer has a second energy band gap in a range which is above the first set of energy band gaps and below the set of forbidden band widths of the potential barrier layers. The range of the third energy band gaps is defined so that the third well layer exhibits carrier accumulations and no electro-luminescence. This ensures that carriers accumulated in the third well layer are injected into the first well layers when the first well layers are deficient in carriers for the electro-luminescence.

In the just above further alternative case, it may preferably be available that the third well layers are provided within every the potential barrier layers. The third well layers have a second set of energy band gaps in the range which is above the first set of energy band gaps and below the set of forbidden band widths of the potential barrier layers. The range of the third set of energy band gaps is defined so that the third well layer exhibits carrier accumulations and no electro-luminescence. The ensures that carriers accumulated in the third well layer are injected into the first well layers when the first well layers are deficient in carriers for the electro-luminescence.

Furthermore alternatively, it may optionally be available to further provide at least a fourth well layer being provided on any interface of the first well layers and the potential barrier layers so that the fourth well layer is sandwiched between the first well layer and the potential barrier layer. The fourth well layer has a fourth energy band gap in the range which is above the first set of energy band gaps and below the set of forbidden band widths of the potential barrier layers. The range of the fourth energy band gap is defined so that the fourth well layer exhibits carrier accumulations and no electro-luminescence. This ensures that carriers accumulated in the fourth well layer are injected into the first well layers when the first well layers are deficient in carriers for the electro-luminescence.

In the above furthermore alternative case, it may optionally be available that the fourth well layers are provided to be sandwiched by every combinations of the first well layers and the potential barrier layers so that every the first well layers are sandwiched between the fourth well layers and the potential barrier layers. The fourth well layers have a fourth set of energy band gaps in the range which is above the first set of energy band gaps and below the set of forbidden band widths of the potential barrier layers. The range of the fourth set of energy band gaps is defined so that the fourth well layer exhibits carrier accumulations and no electro-luminescence. This ensures that carriers accumulated in the fourth well layer are injected into the first well layers when the first well layers are deficient in carriers for the electro-luminescence.

In the above furthermore alternative case, it may also optionally be available that the fourth well layers are provided within every the interfaces of the first well layers and the potential barrier layers so that every the first well layers are sandwiched by the fourth well layers. The fourth well layers have a fourth set of energy band gaps in the range which is above the first set of energy band gaps and below the set of forbidden band widths of the potential barrier layers. The range of the fourth set of energy band gaps is defined so that the fourth well layer exhibits carrier accumulations and no electro-luminescence. This ensures that carriers accumulated in the fourth well layer are injected into the first well layers when the first well layers are deficient in carriers for the electro-luminescence.

In the above preferable case, it may be available to further provide at least a fourth well layer on any interface of the first well layers and the potential barrier layers so that the fourth well layer is sandwiched between the first well layer and the potential barrier layer. The fourth well layer has a fourth energy band gap in the range which is above the first set of energy band gaps and below the set of forbidden band widths of the potential barrier layers. The range of the fourth energy band gap is defined so that the fourth well layer exhibits carrier accumulations and no electro-luminescence. This ensures that carriers accumulated in the fourth well layer are injected into the first well layers when the first well layers are deficient in carriers for the electro-luminescence.

In the just above case, it may preferably available that the fourth well layers are provided to be sandwiched by every combinations of the first well layers and the potential barrier layers so that every the first well layers are sandwiched between the fourth well layers and the potential barrier layers. The fourth well layers have a fourth set of energy band gaps in the range which is above the first set of energy band gaps and below the set of forbidden band widths of the potential barrier layers. The range of the fourth set of energy band gaps is defined so that the fourth well layer exhibits carrier accumulations and no electro-luminescence. This ensures that carriers accumulated in the fourth well layer are injected into the first well layers when the first well layers are deficient in carriers for the electroluminescence.

In the above preferable case, it may also be available that the fourth well layers are provided within every the interfaces of the first well layers and the potential barrier layers so that every the first well layers are sandwiched by the fourth well layers. The fourth well layers have a fourth set of energy band gaps in the range which is above the first set of energy band gaps and below the set of forbidden band widths of the potential barrier layers. The range of the fourth set of energy band gaps is defined so that the fourth well layer exhibits carrier accumulations and no electro-luminescence. This ensures that carriers accumulated in the fourth well layer are injected into the first well layers when the first well layers are deficient in carriers for the electro-luminescence.

Yet further, alternatively, it may be available that the first and second well layers and the potential barrier layers vary in forbidden band width and in wavelength composition as well as in thickness, so that every the first well layers have a uniform energy band gap which corresponds to the pre-determined wavelength, and further so that the second energy band gap is in the range which is above the first set of energy band gaps and below the set of forbidden band widths of the potential barrier layers. The range of the second energy band gap is defined so that the second well layer exhibits carrier accumulations and no electro-luminescence. This ensures that carriers accumulated in the second well layer is injected into the first well layers when the first well layers are deficient in carriers for the electroluminescence.

Still more, alternatively, it may be available that the first well layers have a uniform forbidden band width and a uniform wavelength composition as well as a uniform thickness. The potential barrier layers also have a uniform forbidden band width and a uniform wavelength composition as well as a uniform thickness.

In the just above still more alternative case, it may for example be available that the first well layers have a wavelength composition of 1.67 micrometers and a thickness of 5.0 nanometers as well as a first energy band gap of 0.80 eV. Further, the potential barrier layers have a wavelength composition of 1.15 micrometers and of a thickness 4 micrometers. Furthermore, the second well layer has a wavelength composition of 1.30 micrometers and a thickness of 50 nanometers as well as a second energy band gap which corresponds to the wavelength composition of 1.30 micrometers.

In the just above case, it may more concretely be available that the first well layers are made of +0.6%-strained InGaAs layers. Further, the potential barrier layers are made of non-strained InGaAs layers. Furthermore, the second well layer is made of a non-strained InGaAs layer.

The present invention also provides yet another semiconductor laser device including an active layer structure which is provided on an optical guide layer provided on a surface, having a grating structure, of a semiconductor substrate. The active layer structure comprises a multiple quantum well structure and at least a second well layer. The multiple quantum well structure comprises alternating laminations of first well layers showing electroluminescence and potential barrier layers. The first well layers have a first set of energy band gaps which are uniform and corresponds to the pre-determined wavelength, provided that energy band gap is defined as a difference between a ground level of electrons in conduction band and a ground level of holes in valence band. The second well layer is provided at any side of the multiple quantum well structure so that the second well layer is separated via the potential barrier layers from the first well layers. The second well layer has a second energy band gap in a range which is above the first set of energy band gaps and below a set of forbidden band widths of the potential barrier layers. The range of the second energy band gap is defined so that the second well layer exhibits carrier accumulations and no electro-luminescence. This ensures that carriers accumulated in the second well layer are injected into the first well layers when the first well layers are deficient in carriers for the electroluminescence.

The above well layer, in which carriers are accumulated for injection into the first well layers when the first well layers are deficient in carriers, makes the first well layers free from being deficient in carriers for the electroluminescence. This causes almost no variation in refractive index of a laser medium or a considerable reduction in variation in refractive index of a laser medium. This suppresses an active wavelength chirping.

In the above case, it may preferably be available that the second well layers are provided at opposite sides of the multiple quantum well structure so that the multiple quantum well structure is positioned between the second well layers.

Alternatively, it may be available that the first and second well layers and the potential barrier layers vary in forbidden band width and in wavelength composition as well as in thickness, so that every the first well layers have a uniform energy band gap which corresponds to the predetermined wavelength, and further so that the second energy band gap is in the range which is above the first set of energy band gaps and below the set of forbidden band widths of the potential barrier layers. The range of the second energy band gap is defined so that the second well layer exhibits carrier accumulations and no electro-luminescence. This ensures that carriers accumulated in the second well layer is injected into the first well layers when the first well layers are deficient in carriers for the electroluminescence.

Further alternatively, it may be available that the first well layers have a uniform forbidden band width and a uniform wavelength composition as well as a uniform thickness. The potential barrier layers also have a uniform forbidden band width and a uniform wavelength composition as well as a uniform thickness.

In the just above further alternative case, it may for example be available that the first well layers have a wavelength composition of 1.67 micrometers and a thickness of 5.0 nanometers as well as a first energy band gap of 0.80 eV. Further, the potential barrier layers have a wavelength composition of 1.15 micrometers and of a thickness 4 micrometers. Furthermore, the second well layer has a wavelength composition of 1.30 micrometers and a thickness of 50 nanometers as well as a second energy band gap which corresponds to the wavelength composition of 1.30 micrometers.

In the just above case, it may more concretely be available that the first well layers are made of +0.6%-strained InGaAs layers. Further, the potential barrier layers are made of non-strained InGaAs layers. Furthermore, the second well layer is made of a non-strained InGaAs layer.

EMBODIMENTS

A first embodiment according to the present invention will be described with reference to FIGS. 4, 5A–5C and 6A–6C. A novel laser diode is provided as illustrated in FIGS. 4 and 5A. The novel laser diode is formed on an n-type InP substrate 1. A surface of the n-type InP substrate 1 is formed with a grating 9. An optical guide layer 2 is provided which extends over the grating 9. The optical guide layer 2 is made of InGaAs which has a wavelength composition of 1.2 micrometers. The optical guide layer 2 has a thickness of 0.1 micrometers. An active layer is provided which extends over the optical guide layer 2. The active layer has a multiple quantum well structure including eight quantum wells. The active layer comprises an elector-luminescence region 3-A and a carrier accumulation region 3-B. An optical guide layer 4 is provided which extends over the active layer 3-A and 3-B. The optical guide layer 4 is made of InGaAsP which has a wavelength composition of 1.2 micrometers. The optical guide layer 4 has a thickness of 0.1 micrometers. A p-type InP cladding layer 5 is provided, which extends over the optical guide layer 4. The p-type InP cladding layer 5 has a thickness of 0.05 micrometers and a carrier concentration of $5 \times 10^{17}$ cm$^{-3}$. The above thickness are of the individual layers over the electroluminescence region 3-A. A p-type InP layer 6 is provided which extends over the p-type InP cladding layer 5. The p-type InP layer 6 has a thickness of 1.3 micrometers and a carrier concentration of $5 \times 10^{17}$ cm$^{-3}$. A p-type InGaAsP contact layer 7 is provided which extends over the p-type InP layer 6. The p-type InGaAsP contact layer 7 has a thickness of 0.25 micrometers and a carrier concentration of $8 \times 10^{18}$ cm$^{-3}$. A p-type electrode is provided on the p-type InGaAsP contact layer 7. The above carrier concentration of the p-type InGaAsP contact layer 7 is sufficiently high to form an ohmic contact.

The following descriptions will focus on the multiple quantum well structure of the active layer over the electroluminescence region 3-A and the carrier accumulation region 3-B which are smoothly coupled to each other. FIG. 5B is a diagram illustrative of an energy band gap profile of a multiple quantum well structure in an electroluminescence region of an active layer in a novel laser diode of FIG. 5A. The multiple quantum well structure in the electroluminescence region 3-A comprises alternating laminations of electroluminescence well layers 31 and potential barrier layers 32. The electroluminescence well layer 31 has a wavelength composition of 1.72 micrometers and a thickness of 5.5 nanometers. The electroluminescence well layer 31 comprises +0.8%-strained InGaAs layer. The potential barrier layer 32 has a wavelength composition of 1.15 micrometers and a thickness of 4 micrometers. The potential barrier layer 32 comprises non-strained InGaAs layer. As a result, the electroluminescence well layer 31 has an energy band gap $E_{g1}$ of 0.80 eV, where energy band gap is defined as a difference between ground levels of electrons in a conduction band and holes in a valence band. The energy band gap $E_{g1}$ of 0.80 eV of the electroluminescence well layer 31 is converted into a composition wavelength of 1.55 micrometers.

FIG. 5C is a diagram illustrative of an energy band gap profile of a multiple quantum well structure in the carrier accumulation region of the active layer in the novel laser diode of FIG. 5A. The multiple quantum well structure in the carrier accumulation region 3-B comprises alternating laminations of carrier accumulation well layers 33 and potential barrier layers 34. The carrier accumulation well layer 33 has a wavelength composition of 1.66 micrometers and a thickness of 4.8 nanometers. The carrier accumulation well layer 33 comprises +0.6%-strained InGaAs layer. The potential barrier layer 34 has a wavelength composition of 1.15 micrometers and a thickness of 6 micrometers. The potential barrier layer 34 comprises −0.2%-strained InGaAs layer. As a result, the carrier accumulation well layer 33 has an energy band gap $E_{g2}$ of 0.82 eV, where energy band gap is defined as a difference between ground levels of electrons in a conduction band and holes in a valence band. The energy band gap $E_{g2}$ of 0.82 eV of the carrier accumulation well layer 33 is converted into a composition wavelength of 1.52 micrometers.

FIG. 5D is a diagram illustrative of energy band gap levels of the multiple quantum well structure over the electroluminescence region and the carrier accumulation region in a novel laser diode of FIG. 5A. The energy band gap level $E_{g1}$ of 0.80 eV of the electroluminescence well layer 31 is smoothly shifted into the energy band gap $E_{g2}$ of 0.82 eV of the carrier accumulation well layer 33. The electroluminescence well layer 31 having the energy band gap level $E_{g1}$ of 0.80 eV shows electro-luminescence at a wavelength of 1.55 micrometers. On the other hand, the carrier accumulation well layers 33 exhibit carrier accumulations without any electroluminescence to thereby ensure that carriers accumulated in said second well layers are injected into said first well layers when said first well layers are deficient in carriers for said electro-luminescence. The above carrier accumulation well layer, in which carriers are accumulated for injection into the first well layers when the first well layers are deficient in carriers, makes the first well layers free from being deficient in carriers for the electroluminescence. This causes almost no variation in refractive index of a laser medium or a considerable reduction in variation in refractive index of a laser medium. This suppresses an active wavelength chirping.

The following descriptions are directed to the fabrication processes for the above described novel laser diode with reference to FIGS. 6A through 6C. In the fabrication processes, a metal organic chemical vapor phase epitaxy method is used with selective growth methods using dielectric masks varying in its widths in order to grow thin epitaxial layers having modulations in thickness. The metal organic chemical vapor epitaxy method is disclosed, for example, in O. Kayser "Selective growth of InP/GaInAs in LP-MOVPE and MOMBE/CBE" Journal of Crystal Growth, 107, 1991, pp. 989–998. The selective growth methods using dielectric masks varying in its widths is disclosed, for example, in E. Colas et al., "Lateral and Longitudinal Pattering of semiconductor structure by crystal growth on non-planar and dielectric-masked GaAs substrate: application o thickness-modulated waveguide structures", Journal of Crystal Growth, 107, 1991, pp. 226–230. An optical modulation multiple quantum well distributed fed back laser diode is disclosed, for example, in Kato et al. "Novel MQW DFB LASER DIODE/ MODULATOR INTEGRATED LIGHT SOURCE USING BAND GAP ENERGY CONTROL EPTAXTIAL GROWTH TECHNIQUE", European Conference on Optical Communication, WeB-7-1, 1991, pp. 429–432. A wavelength tunable multiple quantum well distributed Bragg reflector laser diode using band gap energy control is disclosed, for example, in S. Takano et al., "1.55 μm WAVELENGTH-TUNABLE MQW-DBR-LDs EMPLOYING BANDGAP ENERGY CONTROL IN ALL SELECTIVE MOVPE GROWTH", European Conference on Optical Communication, TuB-5-3, 1992, pp. 177–180.

With reference to FIG. 6A, an n-type InP substrate 1 is prepared, which has a surface formed with a λ/4-shifted grating 9. A pair, of dielectric masks M1 is placed over the grating 9. Each of the paired dielectric masks M1 comprises a wide portion on the electro-luminescence region 3-A, an intermediate portion on an intermediate region between the electroluminescence region 3-A and the carrier accumulation region 3-B, and a slender portion on the carrier accumulation region 3-B. The intermediate portion proportionally varies in width. The wide portion of the mask M1 has a width of 12 micrometers and a length of 250 micrometers. The slender portion of the mask M1 has a width of 10 micrometers and a length of 300 micrometers. The intermediate portion of the mask M1 has a length of about 20 micrometers. The above paired masks M1 are arranged to have a constant distance between them. The constant distance between the paired masks M1 is 1.5 micrometers.

The optical guide layer 2, the active layer 3, the optical guide layer 4 and the cladding layer 5 are in turn grown using the above masks M1. The thickness of the individually grown layers 2, 3, 4 and 5 are vary so that the thickness of the layer on the electro-luminescence region 3-A is larger than the thickness of the layer on, the carrier accumulation region 3-B. The wavelength composition is small when the thickness thereof is thin, while the wavelength composition is large when the thickness thereof is thick.

The above used masks M1 are removed, in place of which a pair of another masks M2 is prepared. The masks M2 differs from the masks M1 in the distance between them. Of the masks M1, the distance is about 1.5 micrometers as described above, whilst of the masks M2, the distance is about 5 micrometers.

The InP layer 6 and the contact layer 7 are in turn grown using the masks M2. A dielectric layer 8 is formed, which covers the entire top surface of the substrate 1. A p-electrode 10 is selectively formed on the dielectric layer 8. An n-electrode 11 is formed entirely on the bottom of the substrate 1. The above laser diode is then fabricated.

It was confirmed that when the above laser diode is subjected to a direct modulation at −20% dB, then the above laser diode shows a reduced active wavelength chirping ΔΛ of not more than 0.2 nanometers. By contrast, when the conventional laser diode is subjected to a direct modulation at −20% dB, then the conventional laser diode shows a reduced active wavelength chirping ΔΛ of not more than 0.4 nanometers. The active wavelength chirping, that the above novel laser diode shows, is about a half of the active wavelength chirping, that the above conventional laser diode shows. It was also confirmed that the above novel laser diode has a threshold current of 10 mA. The measured efficiency of the above novel laser diode is not less than 0.2 W/A. The output of the above novel laser diode is not less than 20 mW. The above growth method allows that the optical guide layers have reduced internal losses and show high outputs. The above fabrication processes allows a high yield and a reduction in the cost of manufacturing.

A second embodiment according to the present invention will be described with reference to FIGS. 7 and 8A–8C. A novel laser diode is provided as illustrated in FIGS. 7 and 8A. The novel laser diode is formed on an n-type InP substrate 1. A surface of the n-type InP substrate 1 is formed with a grating 9. An optical guide layer 2 is provided which extends over the grating 9. The optical guide layer 2 is made of InGaAs which has a wavelength composition of 1.2 micrometers. The optical guide layer 2 has a thickness of 0.1 micrometers. An active layer is provided which extends over the optical guide layer 2. The active layer has a multiple quantum well structure including eight quantum wells. An optical guide layer 4 is provided which extends over tie active layer 3. The optical guide layer 4 is made of InGaAsP which has a wavelength composition of 1.2 micrometers. The optical guide layer 4 has a thickness of 0.1 micrometers. A p-type InP cladding layer 5 is provided, which extends over the optical guide layer 4. The p-type InP cladding layer 5 has a thickness of 0.05 micrometers and a carrier concentration of $5\times10^{17}$ cm$^{-3}$. A p-type InP layer 6 is provided which extends over the p-type InP cladding layer 5. The p-type InP layer 6 has a thickness of 1.3 micrometers and a carrier concentration of $5\times10^{17}$ cm$^{-3}$. A p-type InGaAsP contact layer 7 is provided which extends over the p-type InP layer 6. The p-type InGaAsP contact layer 7 has a thickness of 0.25 micrometers and a carrier concentration of $8\times10^{18}$ cm$^{-3}$. A p-type electrode is provided on the p-type InGaAsP contact layer 7. The above carrier concentration of the p-type InGaAsP contact layer 7 is sufficiently high to form an ohmic contact.

The following descriptions will focus on the multiple quantum well structure of the active layer 3 with reference to FIGS. 8B and 8C. The multiple quantum well structure comprises eight periods of the following lamination structures. An electro-luminescence well layer 35 is provided in contact with a bulk region serving as a potential barrier. A potential barrier layer 36 is provided in contact with the electro-luminescence well layer 35. A carrier accumulation well layer 37 is provided in contact with the potential barrier layer 36. The potential barrier layer 36 is provided in contact with the carrier accumulation well layer 37. The electro-luminescence well layer 35 is again provided in contact with the potential barrier layer 36. The potential barrier layer 36 is provided in contact with the electro-luminescence well layer 35. The carrier accumulation well layer 37 is provided in contact with the potential barrier layer 36.

Namely, each of the electro-luminescence well layers 35 is sandwiched between the potential barrier layers 36 as well as each of the carrier accumulation well layers 37 is also sandwiched between the potential barrier layers 36 so that each of the electro-luminescence well layers 35 is separated via the potential barrier layer 36 from each of the carrier accumulation well layers 37.

The electro-luminescence well layer 35 comprises a +0.6%-strained InGaAs layer which has a thickness of 5.0 nanometers and a wavelength composition of 1.67 micrometers. The potential barrier layer 36 comprises a non-strained InGaAs which has a thickness of 3.0 micrometers and a wavelength composition of 1.15 micrometers. The carrier accumulation well layer 37 comprises a non-strained InGaAs layer which has a thickness of 4.0 nanometers and a wavelength composition of 1.40 micrometers. The electroluminescence well layer 35 has an energy band gap $E_{g1}$ of 0.80 eV, where energy band gap is defined as a difference between a ground level of electrons in conduction band and a ground level of holes in valence band. The energy band gap $E_{g1}$ of 0.80 eV of the electro-luminescence well layer 35 is converted into a wavelength of 1.55 micrometers. The carrier accumulation well layer 37 has an energy band gap $E_{g2}$ of 1.00 eV, where energy band gap is defined as a difference between a ground level of electrons in conduction band and a ground level of holes in valence band. The energy band gap $E_{g2}$ of 1.00 eV of the carrier accumulation well layer 37 is converted into a wavelength of 1.25 micrometers.

The above electro-luminescence well layer 35 having the small energy band gap $E_{g1}$ of 0.80 eV shows electroluminescence at a wavelength of 1.55 micrometers. On the other hand, the carrier accumulation well layers 37 exhibit carrier accumulations without any electroluminescence to thereby ensure that carriers accumulated in said second well layers are injected into said first well layers when said first well layers are deficient in carriers for said electroluminescence. The above carrier accumulation well layer, in which carriers are accumulated for injection into the electroluminescence well layers when the electro-luminescence well layers are deficient in carriers, makes the electroluminescence well layers free from being deficient in carriers for the electro-luminescence. This causes almost no variation in refractive index of a laser medium or a considerable reduction in variation in refractive index of a laser medium. This suppresses an active wavelength chirping.

It was confirmed that when the above laser diode is subjected to a direct modulation at −20% dB, then the above laser diode shows a reduced active wavelength chirping $\Delta\lambda$ of not more than 0.2 nanometers. By contrasts when the conventional laser diode is subjected to a direct modulation at −20% dB, then the conventional laser diode shows a reduced active wavelength chirping $\Delta\lambda$ of not more than 0.4 nanometers. The active wavelength chirping, that the above novel laser diode shows, is about a half of the active wavelength chirping, that the above conventional laser diode shows. It was also confirmed that the above novel laser diode has a threshold current of 10 mA. The measured efficiency of the above novel laser diode is not less than 0.2 W/A. The output of the above novel laser diode is not less than 20 mW. The above growth method allows that the optical guide layers have reduced internal losses and show high outputs. The above fabrication processes allows a high yield and a reduction in the cost of manufacturing.

A third embodiment according to the present invention will be described with reference to FIGS. 9 and 10A–10C. A novel laser diode is provided as illustrated in FIGS. 9 and 10A. The novel laser diode is formed on an n-type InP substrate 1. A surface of the n-type InP substrate 1 is formed with a grating 9. An optical guide layer 2 is provided which extends over the grating 9. The optical guide layer 2 is made of InGaAs which has a wavelength composition of 1.2 micrometers. The optical guide layer 2 has a thickness of 0.1 micrometers. An active layer is provided which extends over the optical guide layer 2. The active layer has a multiple quantum well structure including eight quantum wells. An optical guide layer 4 is provided which extends over the active layer 3. The optical guide layer 4 is made of InGaAsP which has a wavelength composition of 1.2 micrometers. The optical guide layer 4 has a thickness of 0.1 micrometers. A p-type InP cladding layer 5 is provided, which extends over the optical guide layer 4. The p-type InP cladding layer 5 has a thickness of 0.05 micrometers and a carrier concentration of $5\times10^{17}$ cm$^{-3}$. A p-type InP layer 6 is provided which extends over the p-type InP cladding layer 5. The p-type InP layer 6 has a thickness of 1.3 micrometers and a carrier concentration of $5\times10^{17}$ cm$^{-3}$. A p-type InGaAsP contact layer 7 is provided which extends over the p-type InP layer 6. The p-type InGaAsP contact layer 7 has a thickness of 0.25 micrometers and a carrier concentration of $8\times10^{18}$ cm$^{-3}$. A p-type electrode is provided on the p-type InGaAsP contact layer 7. The above carrier concentration of the p-type InGaAsP contact layer 7 is sufficiently high to form an ohmic contact.

The following descriptions will focus on the multiple quantum well structure of the active layer 3 with reference to FIGS. 10B and 10C. The multiple quantum well structure comprises eight periods of the following lamination structures. A carrier accumulation layer 38 is provided in contact with a bulk region serving as a potential barrier. An electro-luminescence well layer 39 is provided in contact with the carrier accumulation layer 38. A potential barrier layer 40 is provided in contact with the electroluminescence well layer 39. The carrier accumulation well layer 38 is provided in contact with the potential barrier layer 40.

Namely, each of the electro-luminescence well layers 39 is sandwiched between the potential barrier layer 40 and the carrier accumulation layer 38. In other word, each of the carrier accumulation well layer 38 is sandwiched between the potential barrier layer 40 and the electro-luminescence well layer 39.

The electro-luminescence well layer 39 comprises a +0.6%-strained InGaAs layer which has a thickness of 4.5 nanometers and a wavelength composition of 1.67 micrometers. The potential barrier layer 40 comprises a non-strained InGaAs which has a thickness of 4.0 micrometers and a wavelength composition of 1.15 micrometers. The carrier accumulation well layer 38 comprises a non-strained InGaAs layer which has a thickness of 6.0 nanometers and a wavelength composition of 1.30 micrometers. The electroluminescence well layer 39 has an energy band gap $E_{g1}$ of 0.80 eV, where energy band gap is defined as a difference between a ground level of electrons in conduction band and a ground level of holes in valence band. The energy band gap $E_{g1}$ of 0.80 eV of the electro-luminescence well layer 39 is converted into a wavelength of 1.55 micrometers. The carrier accumulation well layer 38 has an energy band gap $E_{g2}$ of 1.00 eV, where energy band gap is defined as a difference between a ground level of electrons in conduction band and a ground level of holes in valence band. The energy band gap $E_{g2}$ of 1.00 eV of the carrier accumulation well layer 38 is converted into a wavelength of 1.25 micrometers.

The above electro-luminescence well layer 39 having the small energy band gap $E_{g1}$ of 0.80 eV shows electroluminescence at a wavelength of 1.55 micrometers. On the other hand, the carrier accumulation well layers 38 exhibit carrier accumulations without any electroluminescence to thereby ensure that carriers accumulated in said second well layers are injected into said first well layers when said first well layers are deficient in carriers for said electroluminescence. The above carrier accumulation well layer, in which carriers are accumulated for injection into the electroluminescence well layers when the electro-luminescence well layers are deficient in carriers, makes the electroluminescence well layers free from being deficient in carriers for the electro-luminescence. This causes almost no variation in refractive index of a laser medium or a considerable reduction in variation in refractive index of a laser medium. This suppresses an active wavelength chirping.

It was confirmed that when the above laser diode is subjected to a direct modulation at −20% dB, then the above laser diode shows a reduced active wavelength chirping Δλ of not more than 0.2 nanometers. By contrast, when the conventional laser diode is subjected to a direct modulation at −20% dB, then the conventional laser diode shows a reduced active wavelength chirping Δλ of not more than 0.4 nanometers. The active wavelength chirping, that the above novel laser diode shows, is about a half of the active wavelength chirping that the above conventional laser diode shows. It was also confirmed that the above novel laser diode has a threshold current of 10 mA. The measured efficiency of the above novel laser diode is not less than 0.2 W/A. The output of the above novel laser diode is not less than 20 mW. The above growth method allows that the above optical guide layers have reduced internal losses and show high outputs. The above fabrication processes allows a high yield and a reduction in the cost of manufacturing.

A fourth embodiment according to the present invention will be described with reference to FIGS. 11 and 12A–12C. A novel laser diode is provided as illustrated in FIGS. 11 and 12A. The novel laser diode is formed on an n-type InP substrate 1. A surface of the n-type InP substrate 1 is formed with a grating 9. An optical guide layer 2 is provided which extends over the grating 9. The optical guide layer 2 is made of InGaAs which has a wavelength composition of 1.2 micrometers. The optical guide layer 2 has a thickness of 0.1 micrometers. An active layer is provided which extends over the optical guide layer 2. The active layer has a multiple quantum well structure including eight quantum wells. An optical guide layer 4 is provided which extends over the active layer 3. The optical guide layer 4 is made of InGaAsP which has a wavelength composition of 1.2 micrometers. The optical guide layer 4 has a thickness of 0.1 micrometers. A p-type InP cladding layer 5 is provided, which extends over the optical guide layer 4. The p-type InP cladding layer 5 has a thickness of 0.05 micrometers and a carrier concentration of $5 \times 10^{17}$ cm$^{-3}$. A p-type InP layer 6 is provided which extends over the p-type InP cladding layer 5. The p-type InP layer 6 has a thickness of 1.3 micrometers and a carrier concentration of $5 \times 10^{17}$ cm$^{-3}$. A p-type InGaAsP contact layer 7 is provided which extends over the p-type InP layer 6. The p-type InGaAsP contact layer 7 has a thickness of 0.25 micrometers and a carrier concentration of $8 \times 10^{18}$ cm$^{-3}$. A p-type electrode is provided on the p-type InGaAsP contact layer 7. The above carrier concentration of the p-type InGaAsP contact layer 7 is sufficiently high to form an ohmic contact.

The following descriptions will focus on the multiple quantum well structure of the active layer 3 with reference to FIGS. 12B and 12C. The multiple quantum well structure comprises eight periods of alternating laminations of electro-luminescence layers 31 and potential barrier layers 32. A first carrier accumulation layer 41 is provided under the above alternating laminations of the electroluminescence layers 31 and the potential barrier layers 32. The first carrier accumulation layer 41 is separated from the potential barrier layer 32 from the electro-luminescence layers 31. A second carrier accumulation layer 42 is provided over the above alternating laminations of the electroluminescence layers 31 and the potential barrier layers 32. The second carrier accumulation layer 42 is separated from the potential barrier layer 32 from the electro-luminescence layers 31.

Namely, the above alternating laminations of the electroluminescence layers 31 and the potential barrier layers 32 is sandwiched between the first and second carrier accumulation layers 41 and 42.

The electro-luminescence well layer 31 comprises a +0.6%-strained InGaAs layer which has a thickness of 5.0 nanometers and a wavelength composition of 1.67 micrometers. The potential barrier layer 32 comprises a non-strained InGaAs which has a thickness of 4.0 micrometers and a wavelength composition of 1.15 micrometers. The first carrier accumulation well layer 41 has a double hetero structure, and comprises a non-strained InGaAs layer which has a thickness of 50 nanometers and a wavelength composition of 1.30 micrometers. The second carrier accumulation well layer 42 has a double hetero structure, and comprises a non-strained InGaAs layer which has a thickness of 50 nanometers and a wavelength composition of 1.30 micrometers. The electro-luminescence well layer 31 has an energy band gap $E_{g1}$ of 0.80 eV, where energy band gap is defined as a difference between a ground level of electrons in conduction band and a ground level of holes in valence band. The energy band gap $E_{g1}$ of 0.80 eV of the electroluminescence well layer 31 is converted into a wavelength of 1.55 micrometers. The first and second carrier accumulation well layers 41 and 42 have an energy band gap which is converted into a wavelength of 1.30 micrometers.

The above electro-luminescence well layer 31 having the small energy band gap $E_{g1}$ of 0.80 eV shows electroluminescence at a wavelength of 1.55 micrometers. On the other hand, the first and second carrier accumulation well layers 41 and 42 exhibit carrier accumulations without any electro-luminescence to thereby ensure that carriers accumulated in said second well layers are injected into said first well layers when said first well layers are deficient in carriers for said electro-luminescence. The above carrier accumulation well layers, in which carriers are accumulated for injection into the electro-luminescence well layers when the electroluminescence well layers are deficient in carriers, makes the electroluminescence well layers free from being deficient in carriers for the electroluminescence. This causes almost no variation in refractive index of a laser medium or a considerable reduction in variation in refractive index of a laser medium. This suppresses an active wavelength chirping.

It was confirmed that when the above laser diode is subjected to a direct modulation at −20% dB, then the above laser diode shows a reduced active wavelength chirping Δλ of not more than 0.2 nanometers. By contrast, when the conventional laser diode is subjected to a direct modulation at −20% dB, then the conventional laser diode shows a reduced active wavelength chirping Δλ of not more than 0.4 nanometers. The active wavelength chirping, that the above novel laser diode shows, is about a half of the active wavelength chirping, that the above conventional laser diode shows. It was also confirmed that the above novel laser diode has a threshold current of 10 mA. The measured efficiency of the above novel laser diode is not less than 0.2 W/A. The output of the above novel laser diode is not less than 20 mW. The above growth method allows that the optical guide layers have reduced internal losses and show high outputs. The above fabrication processes allows a high yield and a reduction in the cost of manufacturing.

A fifth embodiment according to the present invention will be described with reference to FIGS. 13 and 14A–14C. A novel laser diode is provided as illustrated in FIGS. 13 and 14A. The novel laser diode is formed on an n-type InP substrate 1. A surface of the n-type InP substrate 1 is formed with a grating 9. An optical guide layer 2 is provided which extends over the grating 9. The optical guide layer 2 is made of InGaAs which has a wavelength composition of 1.2 micrometers. The optical guide layer 2 has a thickness of 0.1 micrometers. An active layer is provided which extends over the optical guide layer 2. The active layer has a multiple quantum well structure including eight quantum wells. An optical guide layer 4 is provided which extends over the active layer 3. The optical guide layer 4 is made of InGaAsP which has a wavelength composition of 1.2 micrometers. The optical guide layer 4 has a thickness of 0.1 micrometers. A p-type InP cladding layer 5 is provided, which extends over the optical guide layer 4. The p-type InP cladding layer 5 has a thickness of 0.05 micrometers and a carrier concentration of $5 \times 10^{17}$ cm$^{-3}$. A p-type InP layer 6 is provided which extends over the p-type InP cladding layer 5. The p-type InP layer 6 has a thickness of 1.3 micrometers and a carrier concentration of $5 \times 10^{17}$ cm$^{-3}$. A p-type InGaAsP contact layer 7 is provided which extends over the p-type InP layer 6. The p-type InGaAsP contact layer 7 has a thickness of 0.25 micrometers and a carrier concentration of $8 \times 10^{18}$ cm$^{-3}$. A p-type electrode is provided on the p-type InGaAsP contact layer 7. The above carrier concentration of the p-type InGaAsP contact layer 7 is sufficiently high to form an ohmic contact.

The following descriptions will focus on the multiple quantum well structure of the active layer 3 with reference to FIGS. 14B and 14C. The multiple quantum well structure comprises eight periods of the following lamination structures. An electro-luminescence well layer 35 is provided in contact with a bulk region serving as a potential barrier. A potential barrier layer 36 is provided in contact with the electro-luminescence well layer 35. A carrier accumulation well layer 37 is provided in contact with the potential barrier layer 36. The potential barrier layer 36 is provided in contact with the carrier accumulation well layer 37. The electro-luminescence well layer 35 is again provided in contact with the potential barrier layer 36. The potential barrier layer 36 is provided in contact with the electro-luminescence well layer 35. The carrier accumulation well layer 37 is provided in contact with the potential barrier layer 36.

Namely, each of the electro-luminescence well layers 35 is sandwiched between the potential barrier layers 36 as well as each of the carrier accumulation well layers 37 is also sandwiched between the potential barrier layers 36 so that each of the electro-luminescence well layers 35 is separated view the potential barrier layer 36 from each of the carrier accumulation well layers 37

The electro-luminescence well layer 35 comprises a +0.6%-strained InGaAs layer which has a thickness of 5.0 nanometers and a wavelength composition of 1.67 micrometers. The potential barrier layer 36 comprises a non-strained InGaAs which has a thickness of 3.0 micrometers and a wavelength composition of 1.15 micrometers. The carrier accumulation well layer 37 comprises a non-strained InGaAs layer which has a thickness of 4.0 nanometers and a wavelength composition of 1.40 micrometers. The electroluminescence well layer 35 has an energy band gap $E_{g1}$ of 0.80 eV, where energy band gap is defined as a difference between a ground level of electrons in conduction band and a ground level of holes in valence band. The energy band gap $E_{g1}$ of 0.80 eV of the electro-luminescence well layer 35 is converted into a wavelength of 1.55 micrometers. The carrier accumulation well layer 37 has an energy band gap $E_{g2}$ of 1.00 eV, where energy band gap is defined as a difference between a ground level of electrons in conduction band and a ground level of holes in valence band. The energy band gap $E_{g2}$ of 1.00 eV of the carrier accumulation well layer 37 is converted into a wavelength of 1.25 micrometers.

The above electro-luminescence well layer 35 having the small energy band gap $E_{g1}$ of 0.80 eV shows electroluminescence at a wavelength of 1.55 micrometers. On the other hand, the carrier accumulation well layers 37 exhibit carrier accumulations without any electroluminescence to thereby ensure that carriers accumulated in said second well layers are injected into said first well layers when said first well layers are deficient in carriers for said electroluminescence. The above carrier accumulation well layer, in which carriers are accumulated for injection into the electroluminescence well layers when the electro-luminescence well layers are deficient in carriers, makes the electroluminescence well layers free from being deficient in carriers for the electro-luminescence. This causes almost no variation in refractive index of a laser medium or a considerable reduction in variation in refractive index of a laser medium. This suppresses an active wavelength chirping.

It was confirmed that when the above laser diode is subjected to a direct modulation at −20% dB, then the above laser diode shows a reduced active wavelength chirping Δλ of not more than 0.2 nanometers. By contrast, when the conventional laser diode is subjected to a direct modulation at −20% dB, then the conventional laser diode shows a reduced active wavelength chirping Δλ of not more than 0.4 nanometers. The active wavelength chirping, that the above novel laser diode shows, is about a half of the active wavelength chirping, that the above conventional laser diode shows. It was also confirmed that the above novel laser diode has a threshold current of 10 mA. The measured efficiency of the above novel laser diode is not less than 0.2 W/A. The output of the above novel laser diode is not less than 20 mW. The above growth method allows that the optical guide layers have reduced internal losses and show high outputs. The above fabrication processes allows a high yield and a reduction in the cost of manufacturing.

A third embodiment according to the present invention will be described with reference to FIGS. 15 and 16A–16C. A novel laser diode is provided as illustrated in FIGS. 15 and 16A. The novel laser diode is formed on an n-type InP substrate 1. A surface of the n-type InP substrate 1 is formed with a grating 9. An optical guide layer 2 is provided which extends over the grating 9. The optical guide layer 2 is made of InGaAs which has a wavelength composition of 1.2 micrometers. The optical guide layer 2 has a thickness of 0.1 micrometers. An active layer is provided which extends over the optical guide layer 2. The active layer has a multiple quantum well structure including eight quantum wells. An optical guide layer 4 is provided which extends over the active layer 3. The optical guide layer 4 is made of InGaAsP which has a wavelength composition of 1.2 micrometers. The optical guide layer 4 has a thickness of 0.1 micrometers. A p-type InP cladding layer 5 is provided, which extends over the optical guide layer 4. The p-type InP cladding layer 5 has a thickness of 0.05 micrometers and a carrier concentration of $5 \times 10^{17}$ cm$^{-3}$. A p-type InP layer 6 is provided which extends over the p-type InP cladding layer 5. The p-type InP layer 6 has a thickness of 1.3 micrometers and a carrier concentration of $5 \times 10^{17}$ cm$^{-3}$. A p-type InGaAsP contact layer 7 is provided which extends over the p-type InP layer 6. The p-type InGaAsP contact layer 7 has a thickness of 0.25 micrometers and a carrier concentration of $8 \times 10^{18}$ cm$^{-3}$. A p-type electrode is provided on the p-type InGaAsP contact layer 7. The above carrier concentration of the p-type InGaAsP contact layer 7 is sufficiently high to form an ohmic contact.

The following descriptions will focus on the multiple quantum well structure of the active layer 3 with reference to FIGS. 16B and 16C. The multiple quantum well structure comprises eight periods of the following lamination structures. A carrier accumulation layer 38 is provided in contact with a bulk region serving as a potential barrier. An electroluminescence well layer 39 is provided in contact with the carrier accumulation layer 38. A potential barrier layer 40 is provided in contact with the electroluminescence well layer 39. The carrier accumulation well layer 38 is provided in contact with the potential barrier layer 40.

Namely, each of the electro-luminescence well layers 39 is sandwiched between the potential barrier layer 40 and the carrier accumulation layer 38. In other word, each of the carrier accumulation well layer 38 is sandwiched between the potential barrier layer 40 and the electro-luminescence well layer 39.

The electro-luminescence well layer 39 comprises a +0.6%-strained InGaAs layer which has a thickness of 4.5 nanometers and a wavelength composition of 1.67 micrometers. The potential barrier layer 40 comprises a non-strained InGaAs which has a thickness of 4.0 micrometers and a wavelength composition of 1.15 micrometers. The carrier accumulation well layer 38 comprises a non-strained InGaAs layer which has a thickness of 6.0 nanometers and a wavelength composition of 1.30 micrometers. The electroluminescence well layer 39 has an energy band gap $E_{g1}$ of 0.80 eV, where energy band gap is defined as a difference between a ground level of electrons in conduction band and a ground level of holes in valence band. The energy band gap $E_{g1}$ of 0.80 eV of the electroluminescence well layer 39 is converted into a wavelength of 1.55 micrometers. The carrier accumulation well layer 38 has an energy band gap $E_{g2}$ of 1.00 eV, where energy band gap is defined as a difference between a ground level of electrons in conduction band and a ground level of holes in valence band. The energy band gap $E_{g2}$ of 1.00 eV of the carrier accumulation well layer 38 is converted into a wavelength of 1.25 micrometers.

The above electro-luminescence well layer 39 having the small energy band gap $E_{g1}$ of 0.80 eV shows electroluminescence at a wavelength of 1.55 micrometers. On the other hand, the carrier accumulation well layers 38 exhibit carrier accumulations without any electroluminescence to thereby ensure that carriers accumulated in said second well layers are injected into said first well layers when said first well layers are deficient in carriers for said electroluminescence. The above carrier accumulation well layer, in which carriers are accumulated for injection into the electroluminescence well layers when the electro-luminescence well layers are deficient in carriers, makes the electroluminescence well layers free from being deficient in carriers for the electro-luminescence. This causes almost no variation in refractive index of a laser medium or a considerable reduction in variation in refractive index of a laser medium. This suppresses an active wavelength chirping.

It was confirmed that when the above laser diode is subjected to a direct modulation at –20% dB, then the above laser diode shows a reduced active wavelength chirping $\Delta\lambda$ of not more than 0.2 nanometers. By contrast, when the conventional laser diode is subjected to a direct modulation at –20% dB, then the conventional laser diode shows a reduced active wavelength chirping $\Delta\lambda$ of not more than 0.4 nanometers. The active wavelength chirping, that the above novel laser diode shows, is about a half of the active wavelength chirping, that the above conventional laser diode shows. It was also confirmed that the above novel laser diode has a threshold current of 10 mA. The measured efficiency of the above novel laser diode is not less than 0.2 W/A. The output of the above novel laser diode is not less than 20 mW. The above growth method allows that the optical guide layers have reduced internal losses and show high outputs. The above fabrication processes allows a high yield and a reduction in the cost of manufacturing.

A seventh embodiment according to the present invention will be described with reference to FIGS. 17 and 18A–18C. A novel laser diode is provided as illustrated in FIGS. 17 and 18A. The novel laser diode is formed on an n-type InP substrate 1. A surface of the n-type InP substrate 1 is formed with a grating 9. An optical guide layer 2 is provided which extends over the grating 9. The optical guide layer 2 is made of InGaAs which has a wavelength composition of 1.2 micrometers. The optical guide layer 2 has a thickness of 0.1 micrometers. An active layer is provided which extends over the optical guide layer 2. The active layer has a multiple quantum well structure including eight quantum wells. An optical guide layer 4 is provided which extends over the active layer 3. The optical guide layer 4 is made of InGaAsP which has a wavelength composition of 1.2 micrometers. The optical guide layer 4 has a thickness of 0.1 micrometers. A p-type InP cladding layer 5 is provided, which extends over the optical guide layer 4. The p-type InP cladding layer 5 has a thickness of 0.05 micrometers and a carrier concentration of $5 \times 10^{17}$ cm$^{-3}$. A p-type InP layer 6 is provided which extends over the p-type InP cladding layer 5. The p-type InP layer 6 has a thickness of 1.3 micrometers and a carrier concentration of $5 \times 10^{17}$ cm$^{-3}$. A p-type InGaAsP contact layer 7 is provided which extends over the p-type InP layer 6. The p-type InGaAsP contact layer 7 has a thickness of 0.25 micrometers and a carrier concentration of $8 \times 10^{18}$ cm$^{-3}$. A p-type electrode is provided on the p-type InGaAsP contact layer 7. The above carrier concentration of the p-type InGaAsP contact layer 7 is sufficiently high to form an ohmic contact.

The following descriptions will focus on the multiple quantum well structure of the active layer 3 with reference to FIGS. 18B and 18C. The multiple quantum well structure comprises eight periods of alternating laminations of electro-luminescence layers 31 and potential barrier layers 32. A first carrier accumulation layer 41 is provided under the above alternating laminations of the electro-luminescence layers 31 and the potential barrier layers 32. The first carrier accumulation layer 41 is separated from the potential barrier layer 32 from the electro-luminescence layers 31. A second carrier accumulation layer 42 is provided over the above alternating laminations of the electro-luminescence layers 31 and the potential barrier layers 32. The second carrier accumulation layer 42 is separated from the potential barrier layer 32 from the electro-luminescence layers 31.

Namely, the above alternating laminations of the electroluminescence layers 31 and the potential barrier layers 32 is sandwiched between the first and second carrier accumulation layers 41 and 42.

The electro-luminescence well layer 31 comprises a +0.6%-strained InGaAs layer which has a thickness of 5.0 nanometers and a wavelength composition of 1.67 micrometers. The potential barrier layer 32 comprises a non-strained InGaAs which has a thickness of 4.0 micrometers and a wavelength composition of 1.15 micrometers. The first carrier accumulation well layer 41 has a double hetero structure, and comprises a non-strained InGaAs layer which has a thickness of 50 nanometers and a wavelength composition of 1.30 micrometers. The second carrier accumulation well layer 42 has a double hetero structure, and comprises a non-strained InGaAs layer which has a thickness of 50 nanometers and a wavelength composition of 1.30 micrometers. The electro-luminescence well layer 31 has an energy band gap $E_{g1}$ of 0.80 eV, where energy band gap is defined as a difference between a ground level of electrons in conduction band and a ground level of holes in valence band. The energy band gap $E_{g1}$ of 0.80 eV of the electroluminescence well layer 31 is converted into a wavelength of 1.55 micrometers. The first and second carrier accumulation well layers 41 and 42 have an energy band gap which is converted into a wavelength of 1.30 micrometers.

The above electro-luminescence well layer 31 having the small energy band gap $E_{g1}$ of 0.80 eV shows electroluminescence at a wavelength of 1.55 micrometers. On the other hand, the first and second carrier accumulation well layers 41 and 42 exhibit carrier accumulations without any electroluminescence to thereby ensure that carriers accumulated in said second well layers are injected into said first well layers when said first well layers are deficient in carriers for said electroluminescence. The above carrier accumulation well layers, in which carriers are accumulated for injection into the electro-luminescence well layers when the electroluminescence well layers are deficient in carriers, makes the electroluminescence well layers free from being deficient in carriers for the electroluminescence. This causes almost no variation in refractive index of a laser medium or a considerable reduction in variation in refractive index of a laser medium. This suppresses an active wavelength chirping.

It was confirmed that when the above laser diode is subjected to a direct modulation at −20% dB, then the above laser diode shows a reduced active wavelength chirping Δλ of not more than 0.2 nanometers. By contrast, when the conventional laser diode is subjected to a direct modulation at −20% dB, then the conventional laser diode shows a reduced active wavelength chirping Δλ of not more than 0.4 nanometers. The active wavelength chirping, that the above novel laser diode shows, is about a half of the active wavelength chirping, that the above conventional laser diode shows. It was also confirmed that the above novel laser diode has a threshold current of 10 mA. The measured efficiency of the above novel laser diode is not less than 0.2 W/A. The output of the above novel laser diode is not less than 20 mW. The above growth method allows that the optical guide layers have reduced internal losses and show high outputs. The above fabrication processes allows a high yield and a reduction in the cost of manufacturing.

Whereas modifications of the present invention will no doubt be apparent to a person having ordinary skill in the art, to which the invention pertains, it is understood that embodiments as shown and described by way of illustrations are by no means intended to be considered in a limiting sense. Accordingly, it is to be intended to cover by claims all modifications which fall within the spirit and scope of the present invention.

What is claimed is:

1. An active layer structure provided in a light emission device for emitting a light with a predetermined wavelength, said active layer structure comprising:

an electroluminescence section comprising a first multiple quantum well structure comprising alternating laminations of first well layers showing electroluminescence and first potential barrier layers, said first well layers having a first set of energy band gaps which are uniform and correspond to said predetermined wavelength; and a carrier accumulation section in alignment with said electroluminescence section, said carrier accumulation section comprising a second multiple quantum well structure comprising alternating laminations of second well layers and second potential barrier layers, wherein an energy band gap is defined as a difference between a ground level of electrons in conduction band and a ground level of holes in valence band, wherein said second well layers have a second set of energy band gaps in a range which is above said first set of energy band gaps and below a set of forbidden band widths of said first potential barrier layers, and wherein said range of said second set of energy band gaps is defined so that said second well layers exhibit carrier accumulations and no electroluminescence to thereby ensure that carriers accumulated in said second well layers are injected into said first well layers when said first well layers are deficient in carriers for said electroluminescence.

2. The active layer structure as claimed in claim 1, wherein said first and second well layers and said potential barrier layers vary in forbidden band width and in wavelength composition as well as in thickness, so that each of said first well layers has a uniform energy band gap which corresponds to said predetermined wavelength, and so that said second set of energy band gaps is in said range which is above said first set of energy band gaps and below said set of forbidden band widths of said potential barrier layers, where said range of said second set of energy band gaps is defined so that said second well layers exhibit carrier accumulations and no electroluminescence to thereby ensure that carriers accumulated in said second well layer are injected into said first well layers when said first well layers are deficient in carriers for said electroluminescence.

3. The active layer structure as claimed in claim 1,
wherein said first well layers have a uniform forbidden band width and a uniform wavelength composition as well as a uniform thickness, wherein said first potential barrier layers also have a uniform forbidden band width and a uniform wavelength composition as well as a uniform thickness, wherein said second well layers have a uniform forbidden band width and a uniform wavelength composition as well as a uniform thickness, and wherein said second potential barrier layers also have a uniform forbidden band width and a uniform wavelength composition as well as a uniform thickness.

4. The active layer structure as claimed in claim 3,
wherein said first well layers have a wavelength composition of 1.72 micrometers and a thickness of 5.5 nanometers as well as a first energy band gap of 0.80 eV, wherein said first potential barrier layers have a wavelength composition of 1.15 micrometers and of a thickness 4 micrometers, wherein said second well layers have a wavelength composition of 1.40 micrometers and a thickness of 4.0 nanometers as well as a second energy band gap of 0.82 eV, and wherein said second potential barrier layers have a wavelength composition of 1.15 micrometers and of a thickness 6 micrometers.

5. The active layer structure as claimed in claim 4,
wherein said first well layers are made of +0.8%-strained InGaAs layers, wherein said first potential barrier layers are made of non-strained InGaAs layers, wherein said second well layers are made of +0.6%-strained InGaAs layers, and wherein said second potential barrier layers are made of −0.2%-strained InGaAs layers.

6. The active layer structure as claimed in claim 3, wherein said first energy band gap is gradually changed into said second energy band gap.

7. A semiconductor laser device including an active layer structure which is provided on an optical guide layer provided on a surface, having a grating structure, of a semiconductor substrate, said active layer structure comprising:

an electroluminescence section comprising a first-multiple quantum well structure comprising alternating laminations of first well layers showing electroluminescence and first potential barrier layers, said first well layers having a first set of energy band gaps which are uniform and correspond to said predetermined wavelength; and a carrier accumulation section in alignment with said electroluminescence section, said carrier accumulation section comprising a second multiple quantum well structure comprising alternating laminations of second well layers and second potential barrier layers, wherein an energy band gap is defined as a difference between a ground level of electrons in conduction band and a ground level of holes in valence band, wherein said second well layers have a second set of energy band gaps in a range which is above said first set of energy band gaps and below a set of forbidden band widths of said first potential barrier layers, and wherein said range of said second set of energy band gaps is defined so that said second well layers exhibit carrier accumulations and no electroluminescence to thereby ensure that carriers accumulated in said second well layers are injected into said first well layers when said first well layers are deficient in carriers for said electroluminescence.

8. The semiconductor laser device as claimed in claim 7,
wherein said first and second well layers and said potential barrier layers vary in forbidden band width and in wavelength composition as well as in thickness, so that each of said first well layers have a uniform energy band gap which corresponds to said predetermined wavelength, and so that said second set of energy band gaps is in said range which is above said first set of energy band gaps and below said set of forbidden band widths of said potential barrier layers, where said range of said second set of energy band gaps is defined so that said second well layers exhibit carrier accumulations and no electroluminescence to thereby ensure that carriers accumulated in said second well layer is injected into said first well layers when said first well layers are deficient in carriers for said electroluminescence.

9. The semiconductor laser device as claimed in claim 7,
wherein said first well layers have a uniform forbidden band width and a uniform wavelength composition as well as a uniform thickness, wherein said first potential barrier layers also have a uniform forbidden band width and a uniform wavelength composition as well as a uniform thickness, wherein said second well layers have a uniform forbidden band width and a uniform wavelength composition as well as a uniform thickness, and wherein said second potential barrier layers also have a uniform forbidden band width and a uniform wavelength composition as well as a uniform thickness.

10. The semiconductor laser device as claimed in claim 9,
wherein said first well layers have a wavelength composition of 1.72 micrometers and a thickness of 5.5 nanometers as well as a first energy band gap of 0.80 eV, wherein said first potential barrier layers have a wavelength composition of 1.15 micrometers and of a thickness 4 micrometers, wherein said second well layers have a wavelength composition of 1.40 micrometers and a thickness of 4.0 nanometers as well as a second energy band gap of 0.82 eV, and wherein said second potential barrier layers have a wavelength composition of 1.15 micrometers and of a thickness 6 micrometers.

11. The semiconductor laser device as claimed in claim 10,
wherein said first well layers are made of +0.8%-strained InGaAs layers, wherein said first potential barrier layers are made of non-strained InGaAs layers, wherein said second well layers are made of +0.6%-strained InGaAs layers, and wherein said second potential barrier layers are made of −0.2%-strained InGaAs layers.

12. The semiconductor laser device as claimed in claim 9, wherein said first energy band gap is gradually changed into said second energy band gap.

* * * * *